(12) United States Patent
Zimmerman et al.

(10) Patent No.: US 8,163,582 B2
(45) Date of Patent: *Apr. 24, 2012

(54) METHOD FOR FABRICATING A LIGHT EMITTING DIODE CHIP INCLUDING ETCHING BY A LASER BEAM

(75) Inventors: Scott M. Zimmerman, Basking Ridge, NJ (US); Karl W. Beeson, Princeton, NJ (US); William R. Livesay, San Diego, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/148,894

(22) Filed: Apr. 22, 2008

(65) Prior Publication Data
US 2008/0261341 A1    Oct. 23, 2008

Related U.S. Application Data

(60) Provisional application No. 60/925,961, filed on Apr. 23, 2007.

(51) Int. Cl.
*H01L 21/00* (2006.01)
*H01L 21/46* (2006.01)
*H01L 21/20* (2006.01)

(52) U.S. Cl. .............. 438/46; 438/458; 438/479
(58) Field of Classification Search ............ 438/46, 438/458, 479; 257/E21.034
See application file for complete search history.

(56) References Cited

U.S. PATENT DOCUMENTS

| | | | |
|---|---|---|---|
| 6,002,697 A * | 12/1999 | Govorkov et al. | 372/34 |
| 6,071,795 A | 6/2000 | Cheung et al. | |
| 6,559,075 B1 | 5/2003 | Kelly et al. | |
| 2004/0232439 A1 * | 11/2004 | Gibb et al. | 257/103 |
| 2005/0227455 A1 | 10/2005 | Park et al. | |
| 2007/0164306 A1 * | 7/2007 | Nakahata et al. | 257/103 |

* cited by examiner

*Primary Examiner* — William M. Brewster
(74) *Attorney, Agent, or Firm* — William Propp. Esq

(57) ABSTRACT

A method for fabricating substrate-free LED chips has a multilayer semiconductor structure at least 10 microns thick provided on a growth substrate. One or more arrays of parallel streets are etched into the multilayer semiconductor structure using a first pulsed laser beam. By scanning a second pulsed laser beam through the growth substrate to the multilayer semiconductor structure, the LED chips are detached from the growth substrate while simultaneously forming surface features on the chips.

25 Claims, 21 Drawing Sheets

METHOD FOR FABRICATING A LIGHT EMITTING DIODE CHIP INCLUDING ETCHING BY A LASER BEAM

REFERENCE TO PRIOR APPLICATION

This application claims the benefit of U.S. Provisional Patent Application Ser. No. 60/925,961, filed on Apr. 23, 2007, which is herein incorporated by reference.

TECHNICAL FIELD

The present invention is a method for fabricating a thick light emitting diode chip. The resulting chip is substrate-free and requires no growth substrate or transfer substrate for structural support.

BACKGROUND OF THE INVENTION

Light emitting diodes (LEDs) can be fabricated by epitaxially growing multiple layers of semiconductors on a growth substrate. Inorganic light-emitting diodes can be fabricated from GaN-based semiconductor materials containing gallium nitride (GaN), aluminum nitride (AlN), aluminum gallium nitride (AlGaN), indium nitride (InN), indium gallium nitride (InGaN) and aluminum indium gallium nitride (AlInGaN). Other appropriate materials for LEDs include, for example, aluminum gallium indium phosphide (AlGaInP), gallium arsenide (GaAs), indium gallium arsenide (InGaAs), indium gallium arsenide phosphide (InGaAsP), diamond or zinc oxide (ZnO).

Especially important LEDs for this invention are GaN-based LEDs that emit light in the ultraviolet, blue, cyan and green regions of the optical spectrum. The growth substrate for GaN-based LEDs is typically sapphire ($Al_2O_3$), silicon carbide (SiC), bulk gallium nitride or bulk aluminum nitride.

Typical epitaxial growth methods for thin semiconductor layers include chemical vapor deposition (CVD), metal-organic chemical vapor deposition (MOCVD) and molecular beam epitaxy (MBE). These growth methods are relatively slow and expensive.

In order to produce LED semiconductor layers with greater structural integrity and to reduce current spreading issues, there exists a need for LEDs with at least one thick semiconductor layer. Epitaxial grow methods exist that can grow thicker layers, including liquid phase epitaxy (LPE), vapor phase epitaxy (VPE) and hydride vapor phase epitaxy (HVPE).

Thick layers of GaN-based materials are, however, difficult to etch, especially anisotropically. Etch rates on the order of hundreds of nanometers per minute limit the feature thicknesses that can be economically rendered in these materials. As such, the use of mechanical means such as dicing and laser scribing are typically used even in thin devices. There exists a need for an improved high-speed method for etching and patterning LEDs fabricated with at least one thick semiconductor layer.

Thermal considerations are very important for LEDs, which generate a significant amount of heat during operation. The heat lowers the light output and operating lifetime of the LED. As LED sizes become larger, such heating effects become more important and can seriously degrade the light-output performance and lifetime of the LEDs.

Sapphire is a poor thermal conductor. If the GaN-based semiconductor structure is grown on sapphire, it is desirable to remove the semiconductor structure from the sapphire growth substrate and bond the semiconductor structure to a second transfer substrate that has high thermal conductivity. Cheung et al. in U.S. Pat. No. 6,071,795 disclose a method for separating a thin film of GaN from a sapphire substrate. The method includes irradiating the interface between the GaN film and the substrate with light that is transmitted by the sapphire and strongly absorbed by the GaN film. At the interface, the irradiation causes the decomposition of GaN into gallium metal and gaseous nitrogen. An example irradiation source is a pulsed krypton fluoride (KrF) excimer laser operating at 248 nanometers. The laser beam is raster scanned across the sample. The 248 nm light is transmitted by the sapphire substrate and strongly absorbed by GaN thin film layer. Following irradiation, the exposed sample is heated above the melting point of gallium (30 degrees Celsius) and the substrate and GaN layer are separated. Any gallium residue remaining on the GaN layer after separation can be removed using, for example, a 50:50 volumetric mixture of hydrogen chloride (HCl) and water ($H_2O$). In order to handle the thin GaN layer and prevent the layer from breaking, the side of the GaN layer opposite the growth substrate is bonded to a second transfer substrate before the subsequent irradiation and separation steps.

Cheung et al. do not disclose using a raster-scanned pulsed laser beam to both separate the semiconductor layer from the substrate and to simultaneously form surface features that can be used as light extraction elements in LED devices fabricated from the semiconductor layer. Cheung et al. also do not disclose methods to etch thick semiconductor layers.

Kelly et al. in U.S. Pat. No. 6,559,075 disclose a method for separating two layers of material by exposing the interface between the two materials to electromagnetic radiation to induce decomposition of one of the materials at the interface. One of the layers can be a GaN-based semiconductor material and the other layer can be a substrate. An example electromagnetic radiation source is a pulsed, frequency-tripled, neodymium-doped yttrium-aluminum-garnet (Nd:YAG) laser operating at 355 nanometers. An example substrate is sapphire. The 355-nanometer light is transmitted by the sapphire substrate and absorbed by the GaN-based semiconductor material at the sapphire-GaN interface. The decomposition of GaN results in the formation of gallium metal and nitrogen gas.

Kelly et al. do not disclose using a raster-scanned pulsed laser beam to both separate the semiconductor layer from the substrate and to simultaneously form surface features that can be used as light extraction elements in LED devices fabricated from the semiconductor layer. Kelly et al. also do not disclose methods to etch thick semiconductor layers.

Park et al. in U.S. Patent Application Publication No. 20050227455 disclose a method for separating a layer of material such as GaN from a sapphire substrate. The method includes irradiating the interface between the GaN film and the substrate with laser light that is transmitted by the sapphire and strongly absorbed by the GaN film. An example laser is a pulsed krypton fluoride (KrF) excimer laser operating at 248 nanometers. In one optional method, the laser beam is formed into a line-shaped beam and the line-shaped beam is scanned across the sample. Park et al. do not disclose using a raster-scanned pulsed laser beam to both separate the semiconductor layer from the substrate and to simultaneously form surface features that can be used as light extraction elements in LED devices fabricated from the semiconductor layer. Park et al. also do not disclose methods to etch thick semiconductor layers.

It would be desirable to develop a method to form thick, substrate-free LED chips that did not need the original growth substrate or an attached bonding transfer substrate for structural support. Such substrate-free LED chips could be easily manipulated and bonded to other surfaces or leadframes in any desired pattern to form light emitting devices. As part of such a method, it would be desirable to develop processes to etch thick semiconductor layers. It would also be desirable to develop a method to both separate a semiconductor structure from a growth substrate and to simultaneously form surface features on the LED chips. The surface features can be used as light extraction elements for the LED. The combined separation and surface-feature-forming process would eliminate the separate step of forming light extraction elements after the removal of the LED chips from the growth substrate.

SUMMARY OF THE INVENTION

A method for fabricating thick light emitting diode chips is described. In one embodiment of this invention, an assembly is provided that includes a multilayer semiconductor structure on a growth substrate. The multilayer semiconductor structure includes a first doped layer proximal to the growth substrate, an active region and a second doped layer distal from the growth substrate with an active region interposed between the first doped layer and the second doped layer. The multilayer semiconductor structure is preferably at least 10 microns thick, but can be 30 microns or more thick. A first array of parallel streets is etched substantially through or completely through the multilayer semiconductor structure by scanning a first laser beam directed to the multilayer semiconductor structure. Optionally, a second array of parallel streets is etched at an angle to the first array. The multilayer semiconductor structure is then detached from the growth substrate, forming one or more LED chips. The LED chips are at least 10 microns thick and do not need the original growth substrate or an attached transfer substrate for structural support.

In another embodiment of this invention the detachment of the multilayer semiconductor structure from the growth substrate is done by scanning a second laser beam through the growth substrate to the multilayer semiconductor structure. The second laser beam decomposes the multilayer semiconductor structure at the interface between the two layers and simultaneous forms light-extraction surface features on the multilayer semiconductor structure. The grown substrate is removed and the resulting LED chips, which include light extraction elements, are detached from the growth substrate.

In another embodiment of this invention, the assembly includes an array of first upper electrodes. The resulting substrate-free LED chips each have one upper electrode.

In another embodiment of this invention, a lower electrode is fabricated on each LED chip, so that each chip has one upper electrode and one lower electrode.

In another embodiment of this invention, the assembly includes an array of first upper electrodes and an array of second upper electrodes. The resulting substrate-free LED chips each have two upper electrodes.

In another embodiment of this invention, the multilayer semiconductor structure includes an undoped semiconductor layer adjacent to the lower surface of the multilayer semiconductor structure.

The LED chips fabricated by these methods are at least 10 microns thick and do not need the original growth substrate or an attached transfer substrate for structural support. If the LED chips have bottom light reflecting layers that cover substantially all of the lower surfaces of the chips, the chips will reflect externally incident light with a reflectivity of at least 60%. If the LED chips do not have bottom light reflecting layers, the chips will transmit externally incident light with a transmissivity of at least 60 percent.

BRIEF DESCRIPTION OF THE DRAWINGS

A more detailed understanding of the present invention, as well as other objects and advantages thereof not enumerated herein, will become apparent upon consideration of the following detailed description and accompanying drawings, wherein.

DETAILED DESCRIPTION OF THE PREFERRED EMBODIMENTS

The preferred embodiments of the present invention will be better understood by those skilled in the art by reference to the above listed figures. The preferred embodiments of this invention illustrated in the figures are not intended to be exhaustive or to limit the invention to the precise form disclosed. The figures are chosen to describe or to best explain the principles of the invention and its applicable and practical use to thereby enable others skilled in the art to best utilize the invention.

One embodiment of this invention is a method for fabricating a thick LED semiconductor structure chip. The LED chip is at least 10 microns thick and does not need the original growth substrate or an attached transfer substrate for structural support.

Figure 1A:
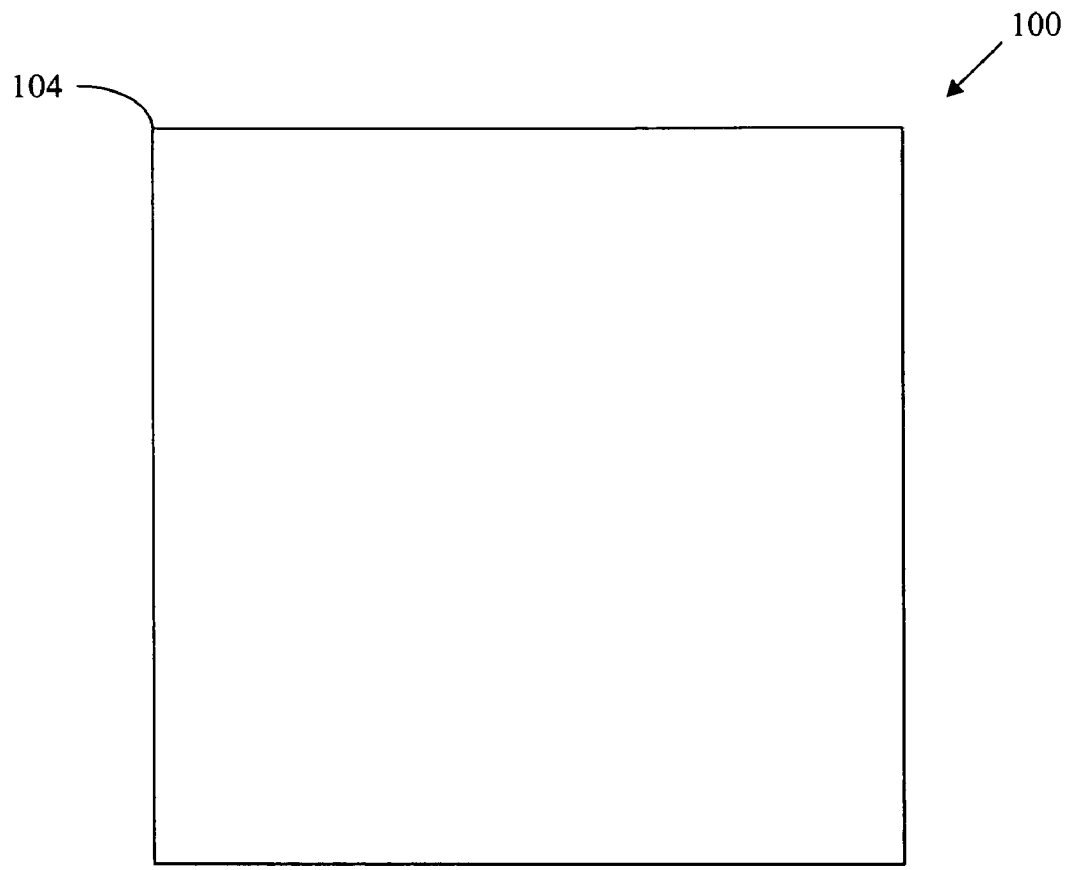
FIG. 1A is top plan view of an assembly of the present invention that includes a growth substrate and a multilayer semiconductor structure.
Figure 1B:
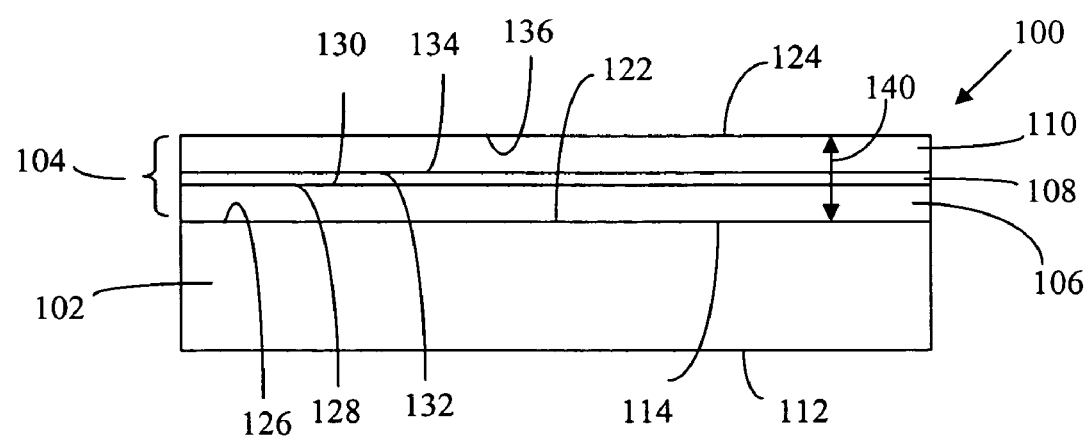
FIG. 1B is cross-sectional side view of the assembly of FIG. 1A.

The first step to form a thick LED chip is to provide an assembly that includes a multilayer semiconductor structure on an optically transparent growth substrate. FIGS. 1A and 1B illustrate assembly 100 that includes a growth substrate 102 and a multilayer semiconductor structure 104. FIG. 1A is a top plan view of assembly 100 and FIG. 1B is a side cross-sectional view of the assembly. The growth substrate 102 has a first or lower surface 112 and a second or upper surface 114 opposite the first surface 112. The multilayer semiconductor structure 104 has a first or lower surface 122 and a second or upper surface 124 opposite the first surface 122. The lower surface 122 of the multilayer semiconductor structure is in contact with the upper surface 114 of the growth substrate.

The multilayer semiconductor structure 104 can be fabricated from any semiconductor material or combination of semiconductor materials. Example materials include GaN-based materials such as, for example, GaN, AlN, AlGaN, InN, InGaN and AlInGaN as well as other semiconductor materials including AlGaInP, GaAs, AlGaAs, InGaAs, InGaAsP, AlGaInP, InP, SiC, Si, ZnO or diamond. Preferred semiconductor materials are GaN-based material such as, for example, GaN, AlN, AlGaN, InN, InGaN and AlInGaN.

The multilayer semiconductor structure can be fabricated with multiple layers of differing materials. In assembly 100, the multilayer semiconductor structure 104 has a first doped layer 106 proximal to the growth substrate, an active region 108 and a second doped layer 110 distal from the growth substrate. The active region is interposed between the first doped layer and the second doped layer. The first doped layer and the second doped layer have opposite polarities. If the first doped layer is an n-doped layer, then the second doped layer is a p-doped layer. If the first doped layer is a p-doped layer, then the second doped layer is an n-doped layer.

The total thickness 140 of the multilayer semiconductor structure 104 is preferably at least 10 microns. More preferably, the total thickness 140 is at least 20 microns. Most preferably, the total thickness 140 is at least 30 microns. A thickness of at least 10 microns is needed to provide structural rigidity to the structure when it is later removed from the growth substrate. In contrast to this, traditional GaN-based LEDs have a multilayer semiconductor structure that is only about two to four microns thick.

The multilayer semiconductor structure 104 in FIG. 1B is not drawn to scale. For example, if the first doped layer 106 is an n-doped layer, then the first doped layer 106 can be much thicker than the second doped layer 110.

The active region 108 of the multilayer semiconductor structure 104 can be a p-n homojunction, a p-n heterojunction, a single quantum well or a multiple quantum well of the appropriate semiconductor material. The active region 108 emits internally generated light in an emitting wavelength range when an electrical current or voltage is applied through the multilayer semiconductor structure. The emitting wavelength range can include any optical wavelength. GaN-based LEDs generally emit light from about 300 nm to about 550 nm. The wavelength of the emitted light depends on the composition of the active region.

The multilayer semiconductor structure may also include other layers in addition to the first doped layer, the active region and the second doped layer. For example the multilayer semiconductor structure can include additional current spreading layers, electron blocking layers or substantially undoped layers. An undoped layer can provide structural rigidity to the multilayer semiconductor structure while minimizing the thicknesses of the n-doped layer and the p-doped layer.

The optical absorptions of n-doped or p-doped GaN, AlN, AlGaN, InN, InGaN and AlInGaN materials differ, but these materials generally strongly absorb light in a portion of the wavelength range from about 200 nm to about 360 nm. The multilayer semiconductor structure 104 can be grown by any standard semiconductor growth technique including, but not limited to, chemical vapor deposition (CVD), metal-organic chemical vapor deposition (MOCVD), liquid phase epitaxy (LPE), vapor phase epitaxy (VPE), hydride vapor phase epitaxy (HVPE) or molecular beam epitaxy (MBE).

Since thicker semiconductor layers are utilized for the thick LED chips of this invention, the optical absorption coefficients for the various layers must be low in order to prevent the absorption of a significant fraction of the internally generated light that is emitted by the active region of the chip. Lower optical absorption within the LED chip will result in higher light extraction from the chip and higher external quantum efficiency.

In some applications, it is also important that the LED chip be either highly transmissive or highly reflective to any externally incident light that comes from other light sources and is directed at the chip. The optical absorption coefficients for the various semiconductor layers must also be low in these cases so that any externally incident light that enters the chip will not undergo significant absorption by the semiconductor layers before exiting the chip.

The multilayer semiconductor structure of the LED chip can absorb light and has an absorption coefficient that depends on wavelength. In many cases, the absorption coefficient is not uniform across the different semiconductor layers of the multilayer semiconductor structure. If the different semiconductor layers that make up the multilayer semiconductor structure have different absorption coefficients, the absorption coefficient for the multilayer semiconductor structure is defined in this specification as the thickness-weighted average absorption coefficient. The weighting function is the fractional thickness of each semiconductor layer in the multilayer semiconductor structure. For example, if 100 percent of the thickness of the multilayer semiconductor structure has a uniform absorption coefficient of 40 per centimeter in the emitting wavelength range, then the thickness-weighted average absorption coefficient is 40 per centimeter. If 50 percent of the thickness of the multilayer semiconductor structure has an absorption coefficient of 30 per centimeter and 50 percent of the thickness of the multilayer semiconductor structure has an absorption coefficient of 50 per centimeter, then the thickness-weighted average absorption coefficient is also 40 per centimeter In order to improve the light extraction efficiency and external quantum efficiency of the LED chip and to improve the transmission or reflectivity of the LED chip to externally incident light, the absorption coefficient (i.e. the thickness-weighted average absorption coefficient) of the multilayer semiconductor structure in the emitting wavelength range of the internally generated light should be less than 20 per centimeter. Preferably the absorption coefficient of the multilayer semiconductor structure in the emitting wavelength range of the internally generated light is less than 10 per centimeter. More preferably, the absorption coefficient of the multilayer semiconductor structure in the emitting wavelength range is less than 5 per centimeter. Most preferably, the absorption coefficient of the multilayer semiconductor structure in the emitting wavelength range is less than 2 per centimeter.

Minimizing the absorption coefficient of the multilayer semiconductor structure in the emitting wavelength range of the internally generated light can be accomplished by improving the deposition processes for the different semiconductor layers in order to reduce impurities or defects and to improve the crystalline structure of the layers.

Thick semiconductor layers can be grown by methods including, but not limited to, CVD, MOCVD, VPE, HVPE and MBE. MOCVD is the most common method for conventional GaN-based LEDs but it has relatively slow deposition rates of approximately 0.1 micron per hour. MOCVD deposited layers also have relatively high optical absorption coefficients due to impurities and defects. HVPE has much faster growth rates and is the preferred method for this invention to grow GaN layers that are more than 5 microns thick. HVPE can have growth rates of up to 10 microns per hour or more and can produce GaN-based LED layers that have optical absorption coefficients significantly less than 20 per centimeter.

The preferred growth method for growing the first doped layer, the second doped layer or both the first doped layer and the second doped layer is HVPE. HVPE does not have the carbon impurities that can be present in the MOCVD processes normally used in GaN LED fabrication. Alternatively, if MOCVD is used to deposit the semiconductor layers, a higher deposition temperature can be used to reduce carbon impurities and crystalline defects in the layers. MOCVD may optionally be used to grow active regions that are single- or multiple quantum wells. If the active region of the LED chip is a p-n homojunction or a p-n heterojunction, preferably the entire multilayer semiconductor structure is fabricated by HVPE.

The growth substrate 102 can be any substrate upon which the multilayer semiconductor structure 104 can be epitaxially grown. The growth substrate should be transparent to any laser beam utilized for subsequent processing. Example growth substrates for GaN-based materials include, but are not limited to, sapphire ($Al_2O_3$), silicon carbide (SiC), bulk GaN, bulk AlN and ZnO. Sapphire is optically transparent in the 200-700 nm wavelength range and is a preferred substrate for this invention.

The details of the structure and fabrication of an illustrative example assembly 100 will now be described.

The growth substrate 102 is sapphire, which is optically transparent between 200 nm and 700 nm. The growth substrate has a first or lower surface 112 and a second to upper surface 114.

The first doped layer 106 is an n-doped GaN layer, which is epitaxially deposited by HVPE or MOCVD onto the growth substrate 102. Preferably the first doped layer is deposited by HVPE. The first doped layer has a first or lower surface 126 and a second or upper surface 128. The lower surface 126 of the n-doped GaN layer is also the first or lower surface 122 of the multilayer semiconductor structure.

The active region 108 is a GaN-based heterojunction, which is epitaxially deposited or otherwise conventionally fabricated on the upper surface 128 of the first doped layer 106. The active region has a first or lower surface 130 and a second or upper surface 132.

The second doped layer 110 is a p-doped GaN layer, which is epitaxially deposited or otherwise conventionally fabricated on the upper surface 132 of the active region 108. The second doped layer has a first or lower surface 134 and a second or upper surface 136. The upper surface 136 of the p-doped GaN layer is also the second or upper surface 124 of the multilayer semiconductor structure.

Optionally a protective layer (not shown) may be applied to the second surface 124 of the multilayer semiconductor structure 104 to protect the surface from debris from the following laser etching step. For example, a film of polyvinyl alcohol and water may be spin coated onto the second surface 124 and dried to form a protective layer.

Figure 2A:
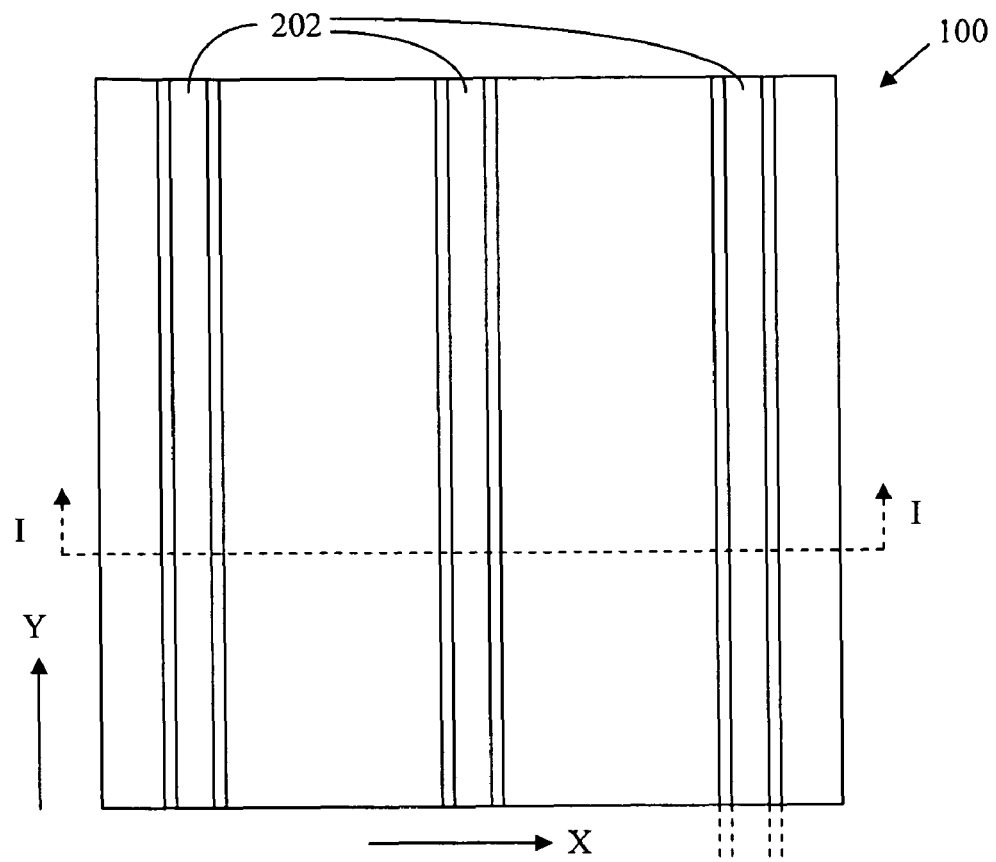
FIG. 2A is top plan view of an assembly of this present invention that illustrates a first array of parallel streets.
Figure 2B:
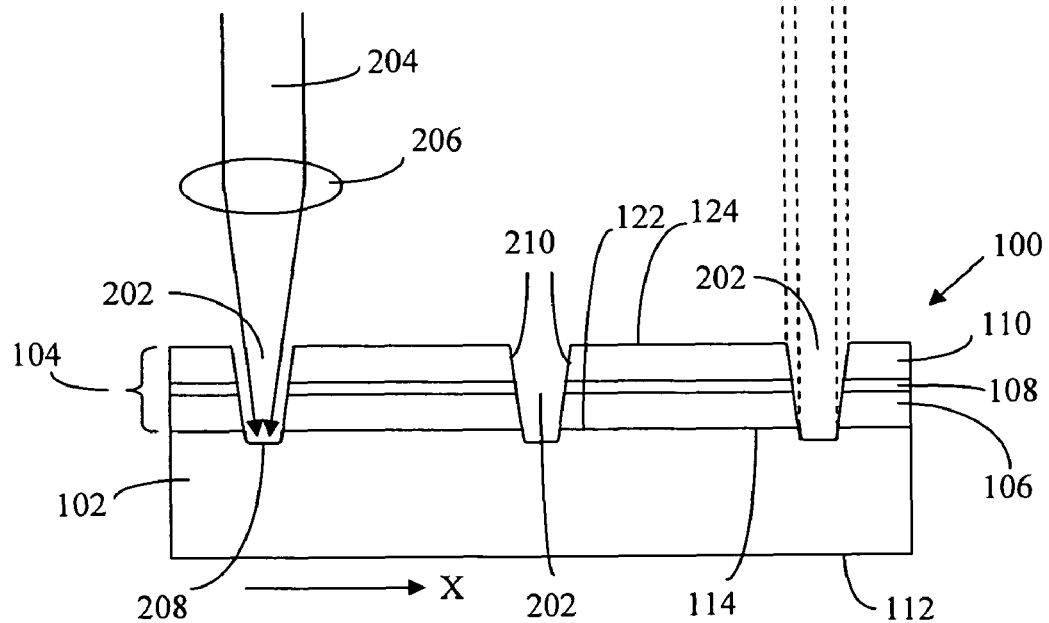
FIG. 2B is cross-sectional side view of the assembly along the I-I plane illustrated in FIG. 2A.

The next step to form a thick LED chip is to etch a first array of parallel streets substantially through or completely through the multilayer semiconductor structure. FIGS. 2A and 2B illustrate assembly 100 that includes a growth substrate 102, a multilayer semiconductor structure 104 and a first array of parallel streets 202 that are etched through the multilayer semiconductor structure in the Y-direction. FIG. 2A is a top plan view of assembly 100 with a first array of parallel streets 202 and FIG. 2B is a side cross-sectional view of the assembly along the I-I plane illustrated in FIG. 2A. In some cases, it may be useful to align the Y-direction either parallel or perpendicular to a crystal plane of the semiconductor materials. The side walls 210 of the first array of parallel streets are shown to be planar, but it is also within the scope of this invention that the sidewalls could also be curved or irregular in shape.

The first array of parallel streets 202 is formed by scanning a first laser beam directed to the second or upper surface 124 of the multilayer semiconductor structure. Preferably the etching is done using a pulsed first laser and a laser ablation process. The pulsed first laser can be any laser that has a wavelength that is strongly absorbed by the multilayer semiconductor structure. Example pulsed first lasers that are strongly absorbed by GaN-based materials include, but are not limited to, a KrF excimer laser operating at 248 nm, a frequency-tripled Nd:YAG laser operating at 355 nm and a frequency-quadrupled Nd:YAG laser operating at 266 nm. A preferred first laser is a frequency-quadrupled Nd:YAG laser operating at 266 nm. An exemplary pulsed, frequency-quadrupled, Nd:YAG laser is a diode-pumped-solid-state (DPSS) laser. A pulsed, DPSS, Nd:YAG laser operating at 266 nm can have a pulse repetition rate of up to 200,000 Hertz or higher. Pulse lengths are typically 1-30 nanoseconds. Other types of lasers having picosecond or femtosecond pulse lengths may also be utilized for the laser etching.

In FIG. 2B, a pulsed first laser beam 204 is directed through a focusing means, for example lens 206, and focused onto the multilayer semiconductor structure 104. The focusing means may also include diffractive or reflective focusing elements. The laser pulses ablate the material of the multilayer semiconductor structure, forming a trench. Preferably, the laser etching goes substantially through the entire thickness of the multilayer semiconductor structure. Alternatively, the first laser beam may go entirely through the multilayer semiconductor structure and also ablate some of the growth substrate 102 in area 208 as illustrated in FIG. 2B. To form the entire first array of parallel streets 202, the first laser beam is sequentially scanned across the surface 124 of assembly 100 in the Y-direction in spatially separated scans. Alternatively the first laser beam is held stationary and assembly 100 is scanned to do the laser etching.

The first laser beam 204 in FIG. 2A can have any cross-sectional shape including, but not limited to, a circle, an oval, a square, a rectangle or a polygon. Preferred laser beam cross-sectional shapes are elongated shapes such as ovals or rectangles. Pulsed laser beams generally have a circular cross-sectional shape (for example, Nd:YAG lasers) or a rectangular cross-sectional shape (for example, excimer lasers). A circular beam can be converted into an elongated oval or rectangular beam using either cylindrical lenses or a mask (neither is shown). If the cross-sectional shape of the laser beam 204 is an oval or a rectangle, the long axis of the oval or rectangle is preferably aligned parallel to the etched trench. The focused beam can have a wide range of length and width dimensions. An exemplary shape for the focused first laser beam is an oval having a width of 2 to 5 microns and a length of 100 to 400 microns.

Figure 3A:
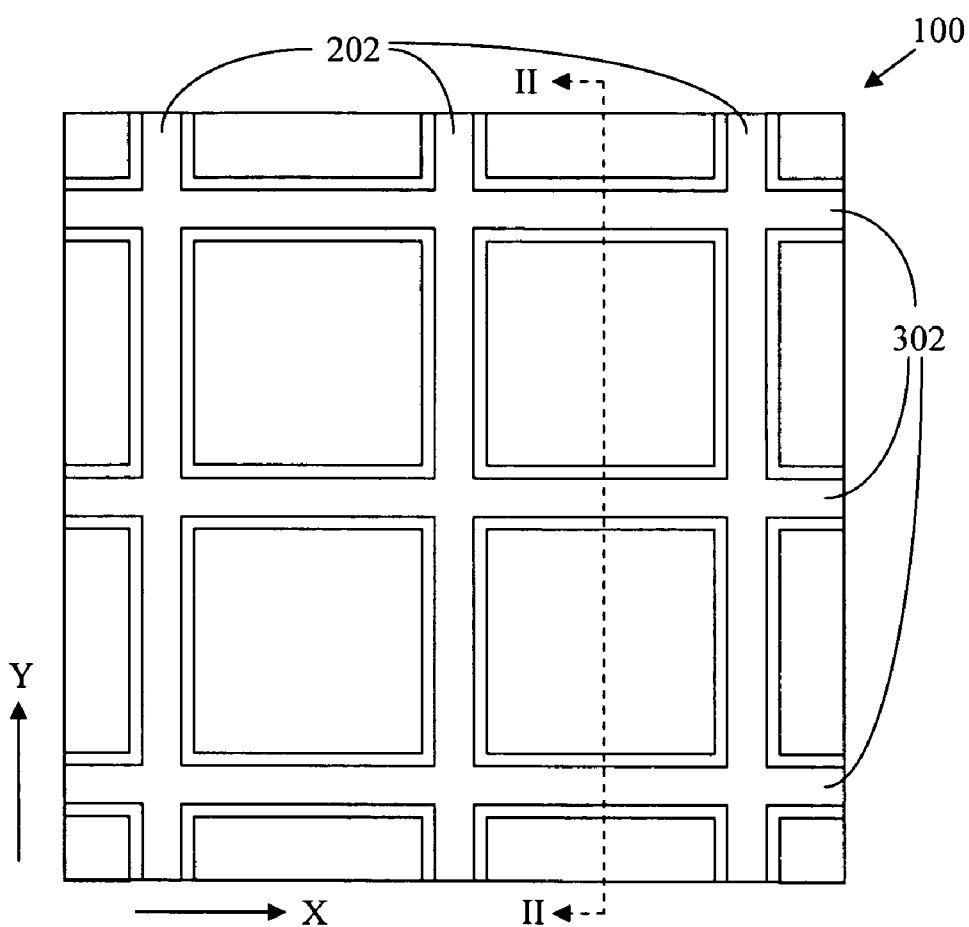
FIG. 3A is top plan view of an assembly of this present invention that illustrates both a first array of parallel streets and an optional second array of parallel streets.
Figure 3B:
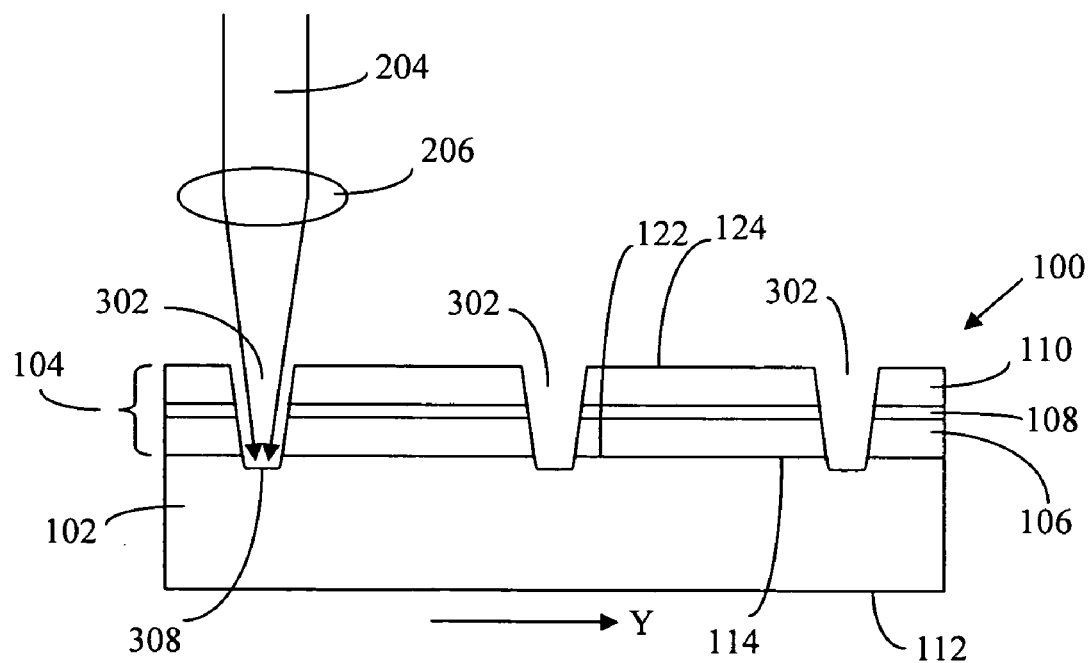
FIG. 3B is cross-sectional side view of the assembly along the II-II plane illustrated in FIG. 3A.

Another optional step to form a thick LED chip is to etch a second array of parallel streets substantially through or completely through the multilayer semiconductor structure at an angle to the first array of parallel streets. FIGS. 3A and 3B illustrate assembly 100 that includes a growth substrate 102, a multilayer semiconductor structure 104, a first array of parallel streets 202 and second array of parallel streets 302 that are laser etched through the multilayer semiconductor structure. FIG. 3A is a top plan view of assembly 100 illustrating two perpendicular arrays of streets and FIG. 3B is a side cross-sectional view of the assembly along the II-II plane illustrated in FIG. 3A.

The second array of parallel streets 302 can be at any angle to the first array of parallel streets 202. Preferably the angle is between about 50 degrees and about 130 degrees. In FIG. 3A, the second array of parallel streets is substantially perpendicular to the first array of parallel streets, where the second array of parallel streets is parallel to the X-direction and the first array of parallel streets is parallel to the Y-direction.

In FIG. 3B, a pulsed first laser beam 204 is directed through a focusing element, for example lens 206, and focused onto the multilayer semiconductor structure 104. The first laser beam ablates the material of the multilayer semiconductor structure, forming a trench. Preferably, the etching goes substantially through the entire thickness of the multilayer semiconductor structure. Alternatively, the laser etching may go entirely through the multilayer semiconductor structure and may also ablate some of the growth substrate 102 in area 308 as illustrated in FIG. 3B. To form the entire second array of parallel streets 302, the first laser beam is sequentially scanned across the surface 124 of assembly 100 in the X-direction. Alternatively, the first laser beam is held stationary and assembly 100 is scanned to do the laser etching.

Figure 4:
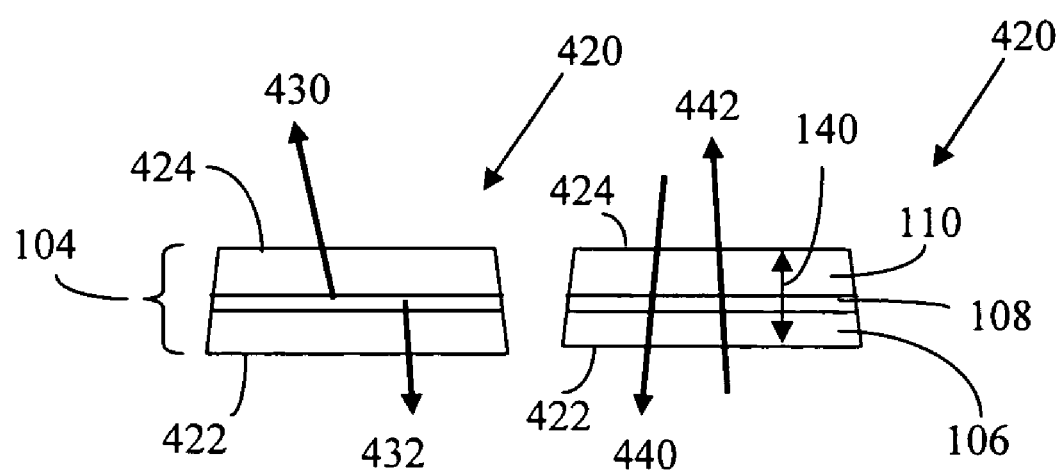
FIG. 4 is side cross-sectional view of light emitting diodes after removal from the growth substrate illustrating light emission and light transmission through the light emitting diode of the present invention.

The next step is to detach the multilayer semiconductor structure from the growth substrate to form one or more thick LED chips. The detachment can be done by any method known in the art. For example, the detachment can be done by optical means such as laser liftoff, chemical means or mechanical means such as grinding to remove the substrate. The resulting LED chips illustrated in FIG. 4 are substrate-free and preferably have a thickness 140 of at least 10 microns, which means the chips do not need the original growth substrate or any attached transfer substrate for structural support. More preferably, the thickness 140 of the LED chips is at least 20 microns. Most preferably, the thickness 140 of the LED chips is at least 30 microns.

The detached structures 420 are substrate-free LEDs, two of which are illustrated in FIG. 4. The LEDs do not have metal electrical contacts, but will emit light if an electrical current or voltage is applied between surfaces 422 and 424.

If desired, either lower side 422 or upper side 424 of LED 420 can be bonded onto a metal surface or leadframe to provide one electrical contact for the LED. Such a surface or leadframe would also provide a thermal pathway to remove heat from the LED. Preferably such a metal surface or leadframe is a light reflector to reflect any internally generated light to the opposite exposed surface of the LED.

Example light rays 430 and 432 in FIG. 4 illustrate the operation of LED 420. If an electrical voltage is applied between surfaces 422 and 424, the active region emits internally generated light. Internally generated light ray 430 is emitted by the active region 108 in the direction of upper surface 424 at an angle less than the critical angle. Internally generated light ray 430 exits LED 420 through surface 424. Internally generated light ray 432 is emitted by the active region 108 in the direction of the lower surface 422 at an angle less than the critical angle. Internally generated light ray 432 exits LED 420 through surface 422.

Another embodiment of this invention is an LED fabricated by the method illustrated in FIGS. 1 to 4. An example of this embodiment is LED 420 illustrated in FIG. 4.

LED chips 420 will transmit externally incident light. Externally incident light is light that is directed to the LED chips from an outside source, such as another LED. Externally incident light is illustrated in FIG. 4 by light rays 440 and 442. Externally incident light ray 440 is incident on the upper surface 424 of LED 420. Externally incident light ray 440 passes through the multilayer semiconductor structure 104 and exits LED through lower surface 422. Externally incident light ray 442 is incident on the lower surface 422 of LED 420. Externally incident light ray 440 passes through the multilayer semiconductor structure 104 and exits LED through upper surface 424.

Preferably, LED chip 420 transmits at least 60 percent of externally incident light incident on the upper or lower surface of the LED. More preferably, LED chip 420 transmits at least 70 of externally incident light. Most preferably, LED chip 420 transmits at least 80 of externally incident light. High light transmission is important to transmit light emitted from one LED through another LED or to transmit light from a phosphor through the LED.

Another embodiment of this invention is a modified method for fabricating a thick LED chip. The LED chip is at least 10 microns thick and does not need the original growth substrate or an attached transfer substrate for structural support. The method is illustrated in FIGS. 1 to 3 and FIGS. 5 to 6. The first steps in this method are identical to the steps in the method described above and are illustrated in FIGS. 1 to 3. First a multilayer semiconductor structure 104 is provided on a growth substrate as illustrated in FIGS. 1A and 1B. Next a first array of parallel streets is etched substantially through or completely through the multilayer semiconductor structure 104 as illustrated in FIGS. 2A and 2B. This is followed by the optional step of etching a second array of parallel streets substantially through or completely through the multilayer semiconductor structure 104 as illustrated in FIGS. 3A and 3B. The details of these steps are explained above for the previous embodiment.

The next step in the modified method to form a thick LED chip is to scan a second laser beam in at least a first direction across and through the growth substrate to form both an interfacial layer of non-uniform thickness between the multilayer semiconductor substrate and the growth substrate and to simultaneously form surface features on the first surface of the multilayer semiconductor substrate. The surface features will function as light extracting elements in the completed LED chip. By forming an interfacial layer for subsequent growth-substrate removal and by simultaneously forming surface features in one step, this method reduces the number of steps required to fabricate LEDs.

Figure 5A:
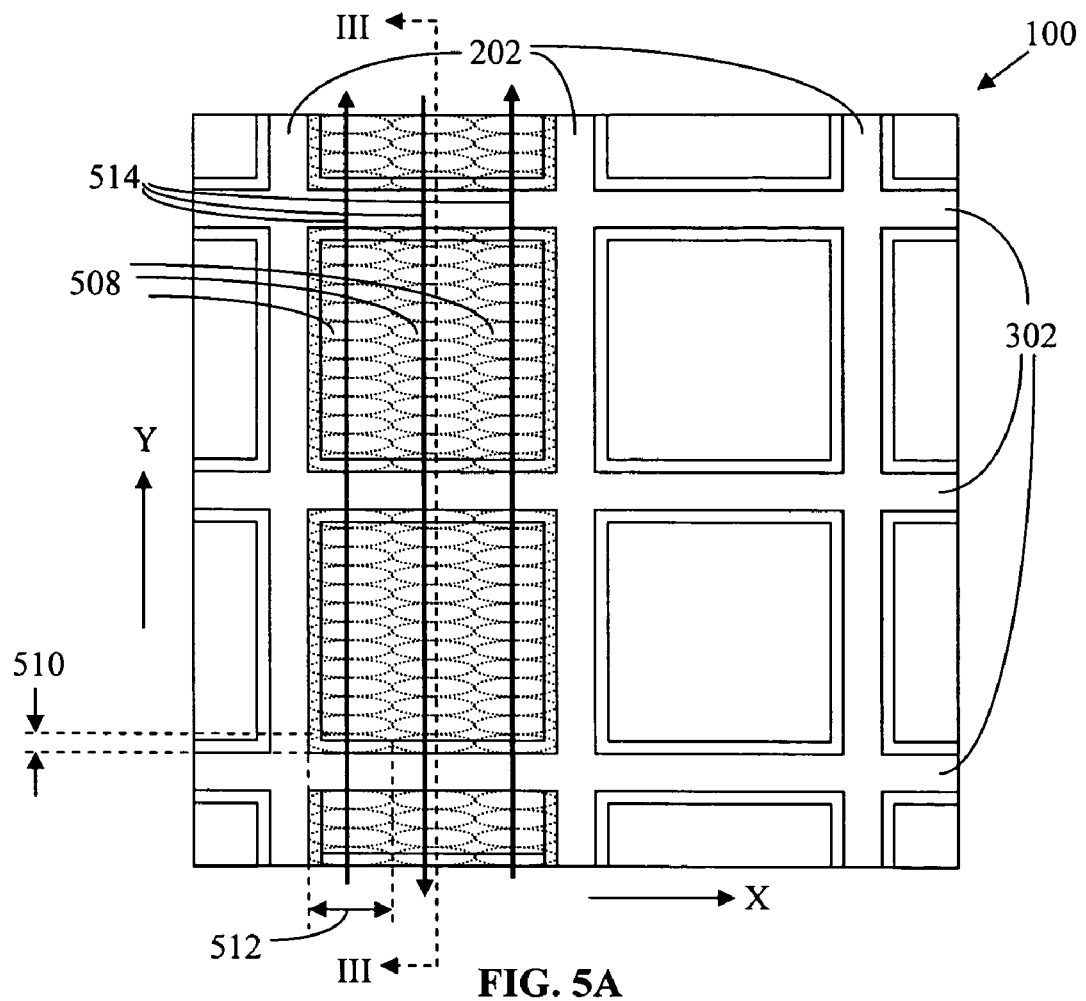
FIG. 5A is top plan view of an assembly of this present invention that illustrates a laser scanning method for simultaneous forming an interfacial layer between a growth substrate and a multilayer semiconductor structure and the formation of surface features on the multilayer semiconductor structure.
Figure 5B:
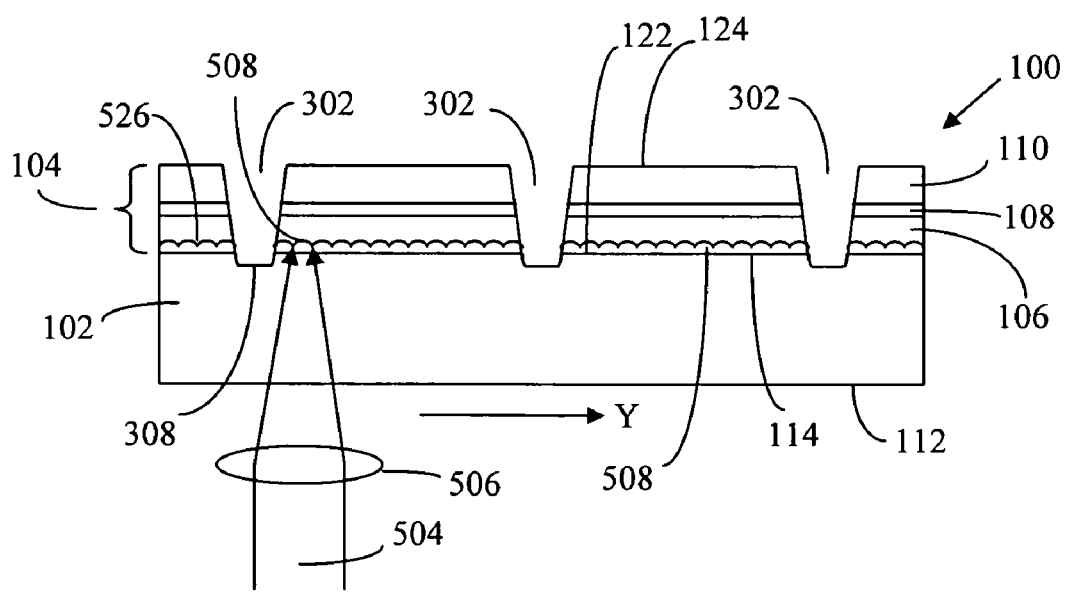
FIG. 5B is cross-sectional side view of the assembly along the III-III plane illustrated in FIG. 5A.

The step of scanning the second laser beam is illustrated in FIGS. 5A and 5B. FIGS. 5A and 5B illustrate assembly 100 that includes a growth substrate 102, a multilayer semiconductor structure 104, a first array of parallel streets 202 and a second array of parallel streets 302. Three illustrated scans 514 of a pulsed second laser beam 504 in the plus Y, minus Y and plus Y-directions form both an interfacial layer 508 of non-uniform thickness and form surface features 526 on the lower surface of the multilayer semiconductor structure. FIG. 5A is a top plan view of assembly 100 and FIG. 5B is a side cross-sectional view of the assembly along the III-III plane illustrated in FIG. 5A. The III-III plane is approximately centered on one of the three laser scans.

The second laser beam 504 can have any cross-sectional shape including, but not limited to, a circle, an oval, a square, a rectangle or a polygon. Preferred second laser beam shapes are elongated shapes such as ovals or rectangles. Elongated shapes can cover more area per pulse resulting in faster scanning times. In this illustrative example, the shape of the second laser beam is an elongated beam in the shape of an oval. Preferably the long axis of the oval is perpendicular to the direction of the laser scan direction.

The second laser beam 504 is focused onto surface 122 of the multilayer semiconductor structure with focusing means 506. Focusing means 506 can be a simple or compound lens, a diffractive element or a reflective element, that focuses the second laser beam onto assembly 100. The interfacial layer 508 formed by the scanned oval-shaped laser beam is illustrated in FIG. 5A as a series of oval-shaped dotted lines, where each oval corresponds to the approximate edges of the interfacial layer formed by one laser pulse. The oval areas formed by consecutive laser pulses may or may not overlap, as desired, in order to facilitate detachment of the growth substrate. The surface features 526 are formed at the edges of the laser exposed areas and are illustrated in cross section in FIG. 5B.

The oval-shaped second laser beam 504 illustrated in FIG. 5B passes through the focusing element 506 and is directed to surface 112 of growth substrate 102. The elongated-shaped laser beam passes through surface 112 of the growth substrate, passes through the interior of the transparent growth substrate, passes through surface 114 of the growth substrate and is absorbed at surface 122 of the multilayer semiconductor structure. At the focus of the laser beam at or near the surface 122, the oval-shaped laser beam has an approximate length 512 and an approximate width 510, where length 512 is greater than width 510. The focused beam can have a wide range of width and length dimensions. An exemplary shape for the focused beam is an oval having a width dimension 510 of 2 to 5 microns and a length dimension 512 of 100 to 400 microns.

In FIG. 5A, the pattern formed by the second laser beam is shown for simplicity to have distinct oval edges illustrated by the dotted lines of the interfacial layer 508. However, a laser beam does not have distinct edges and can have an intensity profile that is Gaussian, for example. If the laser beam has a Gaussian intensity profile, the ovals in FIG. 5A represent the cross-sectional shape of the beam at the regions of the beam that are, for example, 1/e as intense as at the center of the beam. For a Gaussian beam intensity profile, the majority of the beam energy will be inside the ovals, but some of the beam energy will extend outside the ovals. In general, light from adjacent laser pulses will overlap so that the entire surface 122 in the scanned area is exposed by the laser beam. However, it is possible to achieve LED liftoff from the growth substrate even when the pulses are separated by a few microns.

The pulsed second laser in the scanning step is any pulsed laser that has a wavelength that passes through the growth substrate with negligible absorption and then is strongly absorbed by the multilayer semiconductor structure. Example lasers having beams that are strongly absorbed by GaN-based materials include, but are not limited to, a KrF excimer laser operating at 248 nm, a frequency-tripled Nd:YAG laser operating at 355 nm and a frequency-quadrupled Nd:YAG laser operating at 266 nm. A preferred laser is a frequency-quadrupled Nd:YAG laser operating at 266 nm. An exemplary pulsed, frequency-quadrupled, Nd:YAG laser is a diode-pumped-solid-state (DPSS) laser. Other types of lasers having picosecond or femtosecond pulse lengths may also be utilized for this scanning step. The same laser can be used for this scanning step as was used previously for the steps of forming streets or a different type of laser can be used.

A DPSS laser is a preferred second laser for doing the laser scans of assembly 100. A DPSS laser can have a pulse repetition rate of up to 200,000 Hertz or higher compared to a few hundred or few thousand Hertz for an excimer laser. If each laser pulse of a DPSS laser exposes a 3 micron wide by 20 micron long region, for example, the exposed area per pulse is 60 square microns. If the pulse repletion rate is 200,000 Hertz, then a square centimeter of area can be scanned in approximately 8 seconds.

To summarize, in the scanning step illustrated in FIGS. 5A and 5B, the pulsed second laser beam is scanned across the growth substrate in at least a first direction, which in this example is the Y-direction. For purposes of illustration in FIG. 5A, the laser beam is scanned across assembly 100 three times, twice in the plus Y-direction and once in the minus Y-direction. The pulsed second laser beam is transmitted through the growth substrate and absorbed at the first or lower surface of the multilayer semiconductor structure. The pulsed second laser beam decomposes a portion of the first or lower surface 122 of the multilayer semiconductor structure, resulting in the formation of an interfacial layer 508 of non-uniform thickness between the first or lower surface 122 of the multilayer semiconductor structure and the second or upper surface 114 of the growth substrate. Simultaneously, the pulsed laser beam forms surface features 526 on the first or lower surface of the multilayer semiconductor structure.

The first scan direction can be, for example, the Y-direction (plus or minus) or the X-direction (plus or minus). In FIGS. 5A and 5B, the scan direction is the Y-direction (plus or minus). Referring to FIGS. 5A and 5B, the scanning of a pulsed laser beam can be done either by scanning the laser beam 504 in the plus Y or minus Y direction and leaving assembly 100 stationary or by scanning assembly 100 in the minus Y or plus Y direction and leaving the laser beam 504 stationary. Preferably the laser scanning is done by scanning assembly 100.

When the second laser beam 504 that is illustrated in FIG. 5B is absorbed by the multilayer semiconductor structure 104 at surface 122, the surface 122 is decomposed and an interfacial layer 508 of non-uniform thickness is formed. At the same time as the interfacial layer is formed, the laser pulses simultaneously form surface features 526 on the lower surface 122 of the multilayer semiconductor structure. In the example shown in FIGS. 5A and 5B, the surface features are formed in the regions between the centers of the oval laser pulses. The centers of the surface features are between the ovals. If the surface of the multilayer semiconductor structure is GaN, for example, the second laser beam will decompose the GaN into gallium metal and nitrogen gas and form an interfacial layer 508 of non-uniform thickness that is primarily gallium metal.

FIG. 5B, which is a side cross-sectional view along the III-III plane of the assembly 100 illustrated in FIG. 5A, illustrates the thickness variation of the interfacial layer 508 and the profile of the surface features 526 that are formed on the lower surface 122 of the multilayer semiconductor structure. The thickness of the interfacial layer 508 varies depending on the intensity of the laser beam at each point on the scanned surface. At the center of an oval of the interfacial layer 508, which corresponds to the center of the laser pulse where the laser beam has the highest intensity, the interfacial layer 508 will be thicker than at the edges of the oval.

Figure 6:
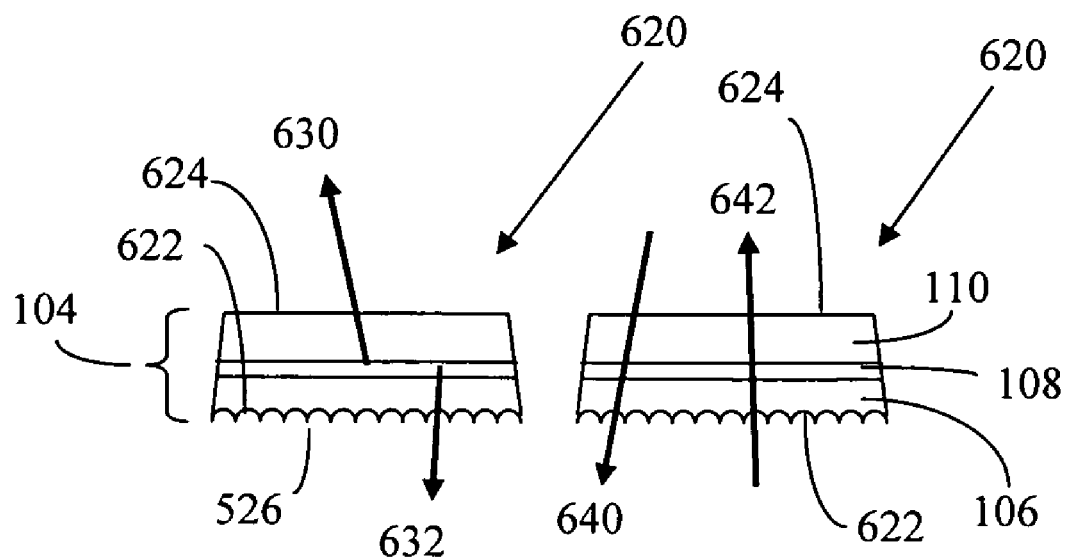
FIG. 6 is side cross-sectional view of substrate-free light emitting diodes that include light extracting elements illustrating light emission and light transmission through the light emitting diode of the present invention.

The surface features 526 on surface 122 have shapes that depend on the intensity profile of the laser beam. In FIG. 5B and FIG. 6, the cross sections of the surface features on surface 122 have curved sidewalls and pointed tips. However, the surface features may also have other shapes. For example, the surface features may have planar sidewalls and the tips may be rounded or flat rather than pointed.

If desired, laser scans to form both the interfacial layer and the surface features can be done in both a first direction (the Y-direction is illustrated in this example) and in a second direction (for example, the X-direction). Scans for the X-direction are not shown in the figures.

The next step to form a thick, substrate-free LED chip is to detach the multilayer semiconductor structure from the growth substrate by severing the interfacial layer. If the multilayer semiconductor structure is a GaN-based material, the interfacial layer will consist of gallium metal and any nitrogen gas that is trapped in the interfacial layer. In many cases, the LED chips will detach from the growth substrate with no additional processing. Gallium metal has a melting point of approximately 30 degrees Celsius. If the LED chips do not immediately detach, assembly 100 can be heated to a temperature above 30 degrees Celsius to melt the gallium and allow for easy separation. For example, the heating may be done by placing assembly 100 in hot water with a temperature in excess of 30 degrees Celsius.

The detached structures 620 are substrate-free LEDs, two of which are illustrated in FIG. 6. Any residue of gallium metal that remains on the layered semiconductor structure can be removed by a cleaning step (not shown). For example, any gallium metal residue can be removed using a 50:50 volumetric mixture of hydrogen chloride (HCl) and water or by using a mixture of potassium hydroxide and ethylene glycol.

Another embodiment of this invention is an LED fabricated by the method illustrated in FIGS. 1 to 3 and FIGS. 5 to 6. An example of this embodiment is LED 620 illustrated in FIG. 6.

The LEDs 620 have surface features 626 which can act as light extracting elements. The LEDs do not have metal electrical contacts, but will emit light if an electrical current is applied between surfaces 622 and 624.

Example light rays 630 and 632 in FIG. 6 illustrate the operation of LED 620. If an electrical voltage is applied between surfaces 622 and 624, the active region emits internally generated light. Internally generated light ray 630 is emitted by the active region 108 in the direction of upper surface 624 at an angle less than the critical angle. Internally generated light ray 630 exits LED 620 through surface 624. Internally generated light ray 632 is emitted by the active region 108 in the direction of the lower surface 622 at an angle less than the critical angle. Internally generated light ray 632 exits LED 620 through surface 622.

If desired, either side 622 or side 624 of LED 620 can be bonded onto a metal surface or leadframe to provide one electrical contact for the LED. Such a surface would also provide a thermal pathway to remove heat from the LED.

Preferably such a metal surface is a light reflector to reflect any internally generated light to the opposite surface of the LED.

LED chips 620 will transmit externally incident light. Externally incident light is light that is directed to the LED chips from an outside source such as another LED. Externally incident light is illustrated in FIG. 6 by light rays 640 and 642. Externally incident light ray 640 is incident on the upper surface 624 of LED 620. Externally incident light ray 640 passes through the multilayer semiconductor structure 104 and exits LED through lower surface 622. Externally incident light ray 642 is incident on the lower surface 622 of LED 620. Externally incident light ray 640 passes through the multilayer semiconductor structure 104 and exits LED through upper surface 624.

Preferably, LED chip 620 transmits at least 60 percent of externally incident light that is incident on the upper or lower surface of the LED. More preferably, LED chip 620 transmits at least 70 of externally incident light. Most preferably, LED chip 620 transmits at least 80 of externally incident light. High light transmission is important to transmit light emitted from one LED through another LED or to transmit light from a phosphor through the LED.

By further modifying the methods described above, LEDs can be fabricated such that each LED has either one electrode or two electrodes.

Another embodiment of this invention is a method to fabricate an LED that has a first upper electrode in electrical contact with the second or upper surface of the multilayer semiconductor structure. The method is illustrated in FIGS. 7 to 11A. The method is nearly identical to the modified method described above in FIGS. 1 to 3 and FIGS. 5 to 6 for fabricating an LED starting with assembly 100. However, the starting assembly 700 for the modified method includes a first array of first upper electrodes that is not present in assembly 100.

Figure 7A:
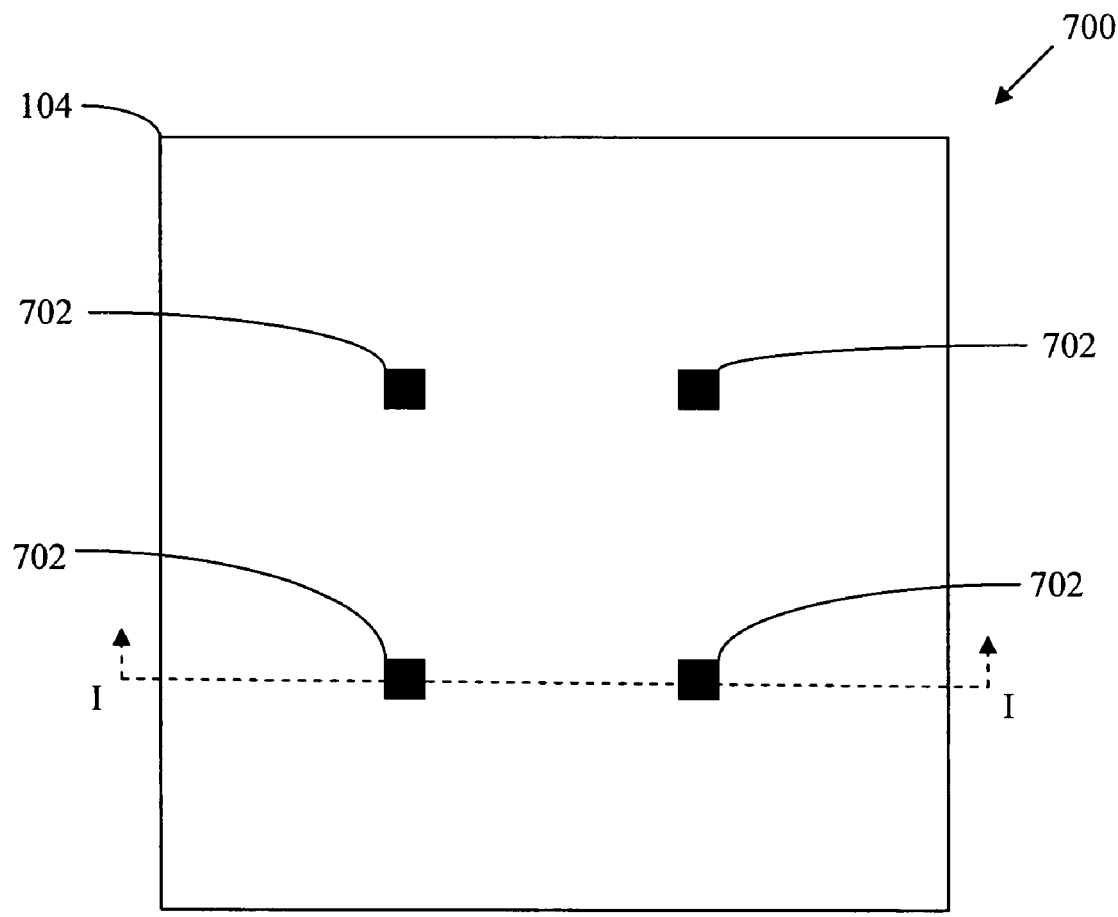
FIG. 7A is top plan view of an assembly of the present invention that includes a growth substrate, a multilayer semiconductor structure and an array of first upper electrodes.
Figure 7B:
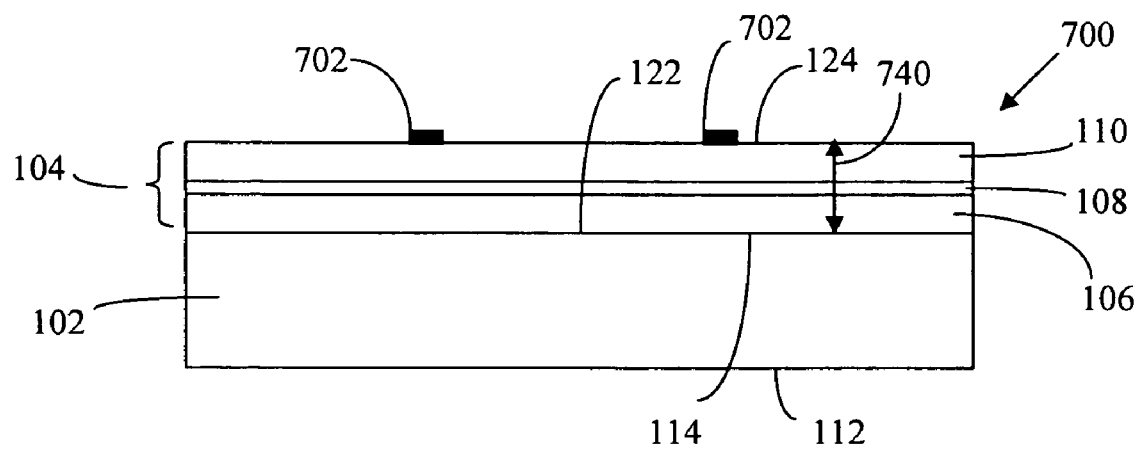
FIG. 7B is cross-sectional side view of the assembly along the I-I plane illustrated in FIG. 7A.

The first step to form a thick, substrate-free LED chip that has one electrode is to provide an assembly 700 that includes a multilayer semiconductor structure on an optically transparent growth substrate. The multilayer semiconductor structure includes a first doped layer proximal to the growth substrate, a second doped layer distal from the growth substrate and an active region interposed between the first doped layer and the second doped layer. Assembly 700 in FIGS. 7 to 11 is identical to assembly 100 in FIGS. 1 to 3 and FIGS. 5 to 6 except that assembly 700 includes a first array of first upper electrodes 702. FIGS. 7A and 7B illustrate assembly 700 that includes a growth substrate 102, a multilayer semiconductor structure 104 and a first array of first upper electrodes 702. FIG. 7A is a top plan view of assembly 700 and FIG. 7B is a side cross-sectional view of the assembly. The growth substrate 102 has a first or lower surface 112 and a second or upper surface 114 opposite the first surface 112. The multilayer semiconductor structure 104 has a first or lower surface 122 and a second or upper surface 124 opposite the first surface 122. The lower surface 122 of the multilayer semiconductor structure is in contact with the upper surface 114 of the growth substrate.

The first array of first upper electrodes 702 is in electrical contact with the second or upper surface 124 of the multilayer semiconductor structure. The first upper electrodes 702 are made from one or more electrically conductive materials. Example materials include, but are not limited to, metals such as gold, aluminum, silver and titanium and transparent conductive oxides (TCOs) including, but not limited to, indium tin oxide (ITO). Usually, the electrodes cover only a portion of the second surface of the multilayer semiconductor structure. The electrically conductive materials are deposited by standard deposition techniques and patterned lithographically to form the array. Optionally, the first array of first upper electrodes can be a uniform layer (not shown) that covers substantially the entire second surface 124 of the multilayer semiconductor structure 104. The first array of first upper electrodes can cover substantially the entire second surface 124 if the electrodes are transparent or partially transparent. Although the first array of first upper electrodes is shown to be provided or formed on the multilayer semiconductor structure before any of the etching or liftoff steps are done, it is within the scope of this invention that the first array of first upper electrodes can be formed at any time in the process, including being formed as the last step of the process.

The multilayer semiconductor structure 104 and the growth substrate 102 for assembly 700 in FIGS. 7 to 11 are identical to the corresponding elements in the previously described assembly 100 illustrated in FIGS. 1 to 3 and FIGS. 5 to 6.

The total thickness 740 of the multilayer semiconductor structure 104 in assembly 700 is preferably at least 10 microns. A thickness of at least 10 microns is needed to provide structural rigidity to the structure when it is later removed from the growth substrate. More preferably, the total thickness 740 is at least 20 microns. Most preferably, the total thickness 740 is at least 30 microns.

The growth substrate 102 can be any substrate upon which the multilayer semiconductor structure 104 can be epitaxially grown. The growth substrate should be transparent to any laser beam utilized for subsequent processing. Sapphire is optically transparent in the 200 to 700 nm wavelength range and is a preferred substrate for this invention.

Optionally a protective layer (not shown) may be applied to the second surface 124 of the multilayer semiconductor structure 104 and to the first array of first upper electrodes 702 in order to protect the surfaces from debris from the following laser etching step. For example, a film of polyvinyl alcohol and water may be spin coated onto the second surface 124 and dried to form a protective layer.

Figure 8A:
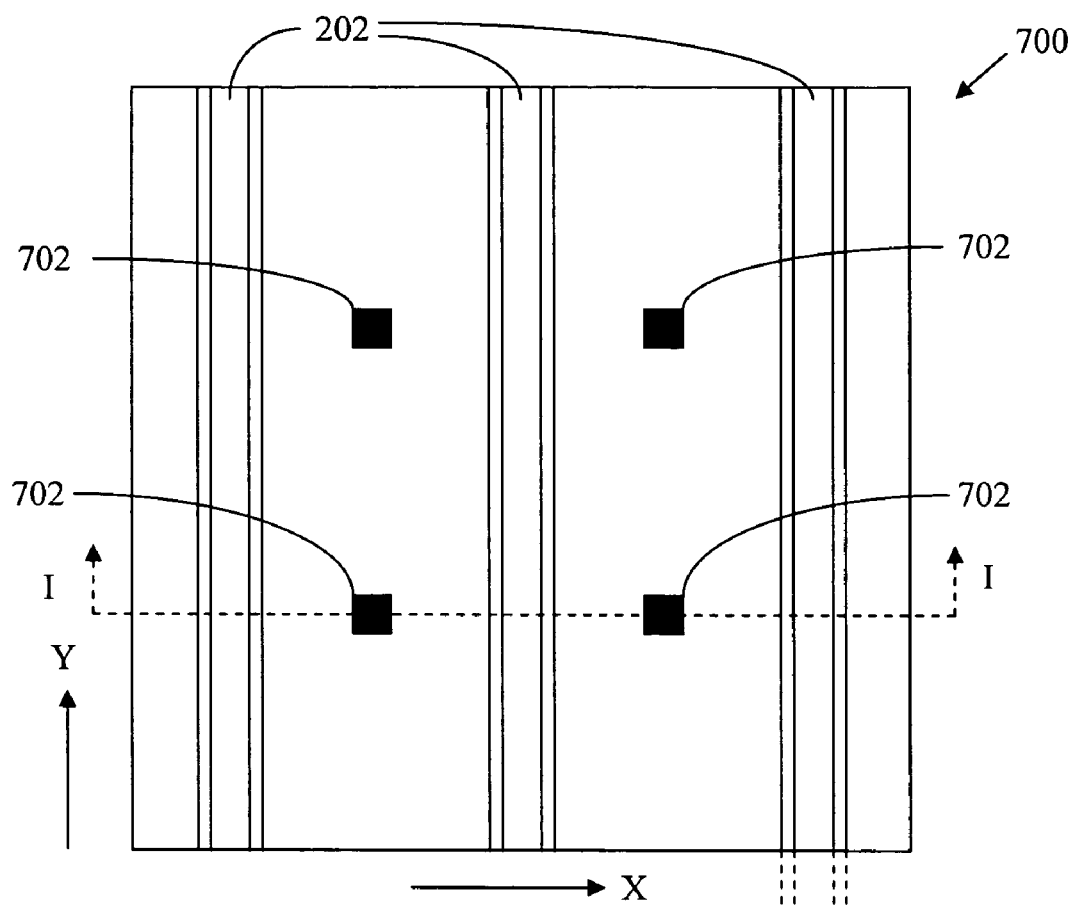
FIG. 8A is top plan view of an assembly of this present invention that illustrates a first array of parallel streets.
Figure 8B:
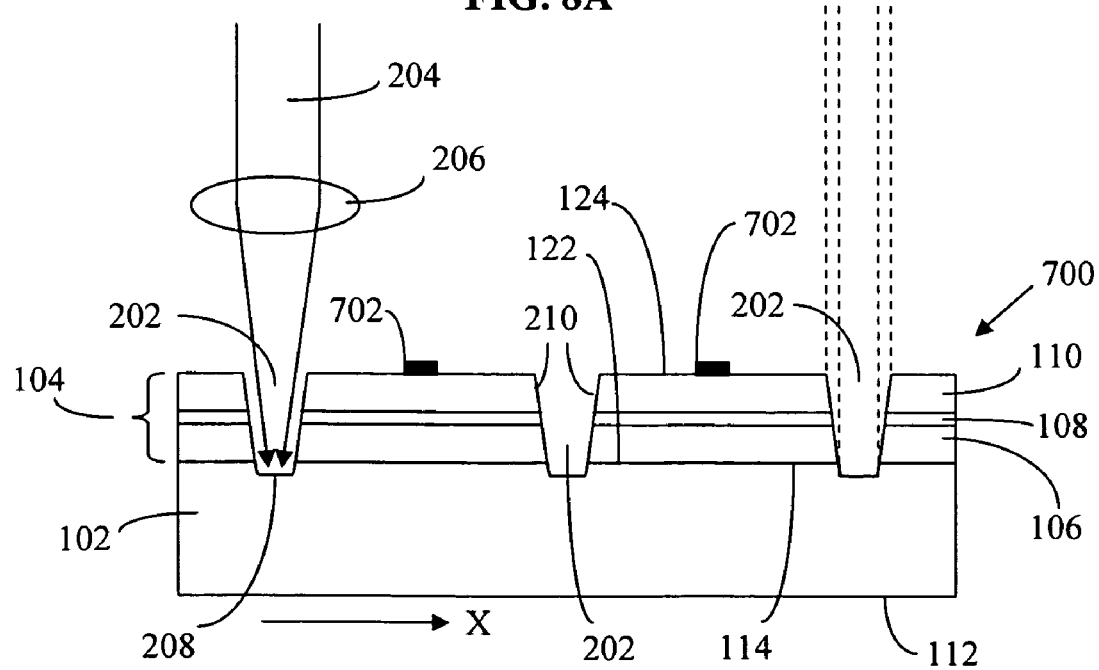
FIG. 8B is cross-sectional side view of the assembly along the I-I plane illustrated in FIG. 8A.

The next step to form a thick, substrate-free LED chip that has one electrode is to etch a first array of parallel streets through the multilayer semiconductor structure in a first direction. If the array of first upper electrodes covers substantially the entire surface 124, then the etching step will also etch through the electrode material. FIGS. 8A and 8B illustrate assembly 700 that includes a growth substrate 102, a multilayer semiconductor structure 104, a first array of first upper electrodes 702 and a first array of parallel streets 202 that are etched through the multilayer semiconductor structure in the Y-direction. FIG. 8A is a top plan view of assembly 700 with a first array of parallel streets 202 and FIG. 8B is a side cross-sectional view of the assembly along the I-I plane illustrated in FIG. 8A. The first array of parallel streets 202 in FIGS. 8A and 8B is identical to the first array of parallel streets 202 in FIGS. 2A and 2B and is fabricated in the same way as in FIGS. 2A and 2B.

The first array of parallel streets 202 in FIGS. 8A and 8B is formed by scanning a first laser beam directed to the second or upper surface of the multilayer semiconductor structure. Preferably the etching is done using a pulsed laser and a laser ablation process. The process conditions for etching assembly 700 are substantially identical to the process conditions for etching that were discussed above for assembly 100. However, if the first array of first upper electrodes covers substantially the entire surface 124, then the etching will also etch through the electrode material.

In FIG. 8B, a pulsed first laser beam 204 is directed through a focusing element, for example lens 206, and focused onto the multilayer semiconductor structure 104. The laser pulses ablate the material of the multilayer semiconductor structure, forming a trench. Preferably, the etching goes through substantially the entire thickness of the multilayer semiconductor structure. Alternatively, the laser etching may go entirely through the multilayer semiconductor structure and also ablate some of the growth substrate 102 in area 208 as illustrated in FIG. 8B. To form the entire array of streets 202, the laser beam is sequentially scanned across the surface 124 of assembly 700 in the Y-direction. Alternatively the laser beam is held stationary and assembly 200 is scanned.

Figure 9A:
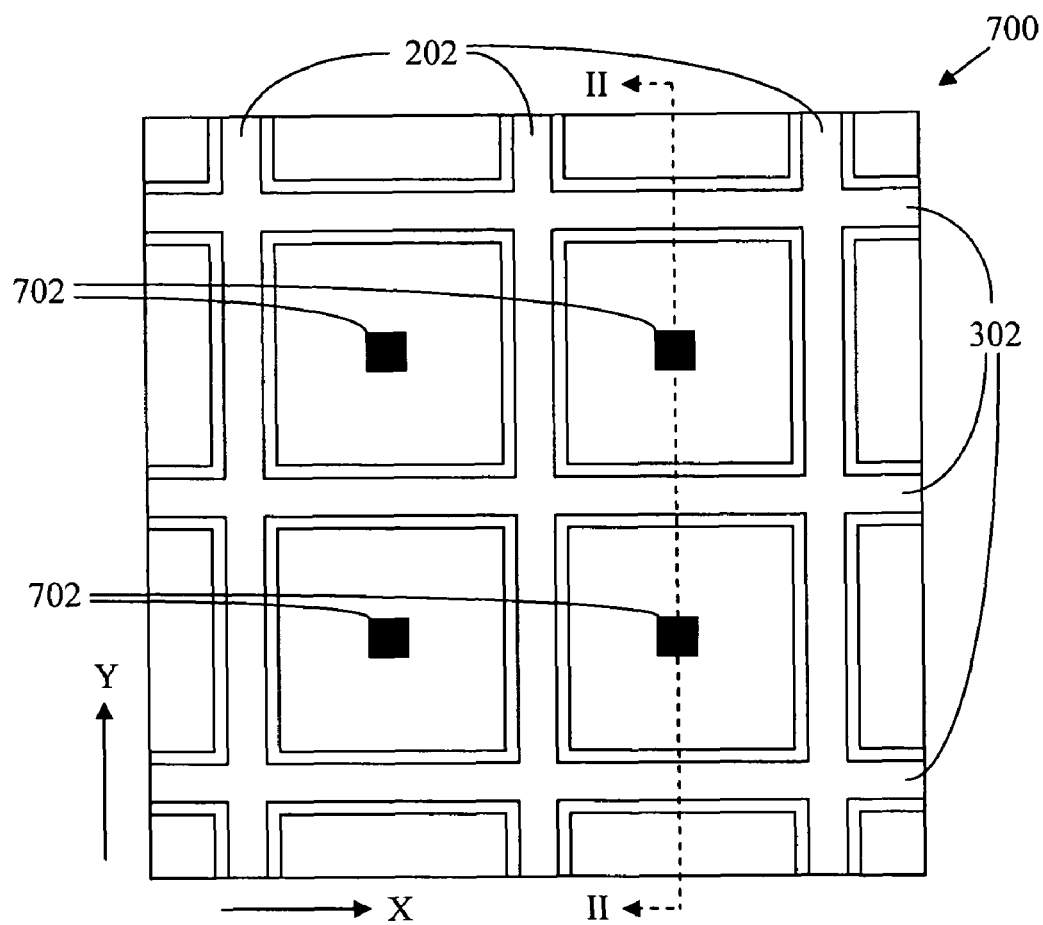
FIG. 9A is top plan view of an assembly of this present invention that illustrates both a first array of parallel streets and an optional second array of parallel streets.
Figure 9B:
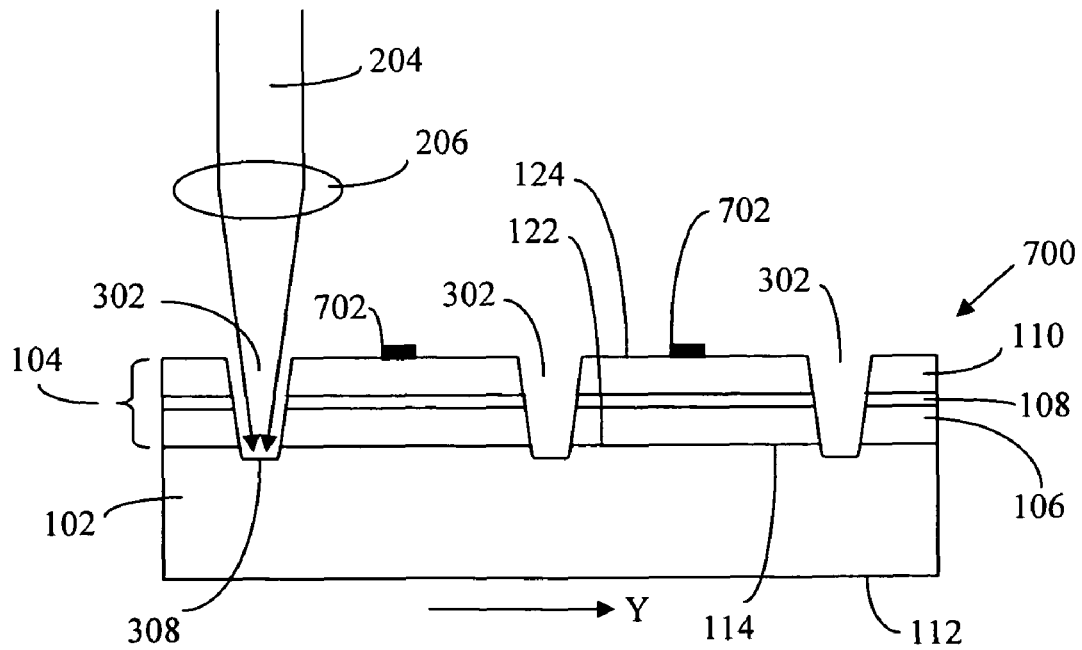
FIG. 9B is cross-sectional side view of the assembly along the II-II plane illustrated in FIG. 9A.

An optional step to form a thick, substrate-free LED chip is to etch a second array of parallel streets through the multilayer semiconductor structure at an angle to the first array. FIGS. 9A and 9B illustrate assembly 700 that includes a growth substrate 102, a multilayer semiconductor structure 104, a first array of first upper electrodes 702, a first array of parallel streets 202 and a second array of parallel streets 302 that are etched through the multilayer semiconductor structure. FIG. 9A is a top plan view of assembly 700 illustrating two perpendicular arrays of streets and FIG. 9B is a side cross-sectional view of the assembly along the II-II plane illustrated in FIG. 9A.

The angled direction for the second array of parallel streets 302 can be at any angle to the first direction for the first array of parallel streets 202. Preferably the angle is between about 50 degrees and about 130 degrees. In FIG. 9A, the angled direction is substantially perpendicular to the first direction. The angled direction is the X-direction and the first direction is the Y-direction.

Etching to form the second array of parallel streets 302 is done using a laser ablation process and a pulsed first laser beam. The etching process for assembly 700 is usually identical to the etching process illustrated above for assembly 100. However, if the first array of first upper electrodes 702 in FIGS. 9A and 9B covers substantially the entire surface 124, then the etching step will also etch through the electrode material.

In FIG. 9B, a pulsed first laser beam 204 is directed through a focusing element, for example lens 206, and focused onto the multilayer semiconductor structure 104. The first laser beam pulses ablate the material of the multilayer semiconductor structure, forming a trench. Preferably, the etching goes through substantially the entire thickness of the multilayer semiconductor structure. Alternatively, the laser ablation goes through the entire thickness of the multilayer semiconductor structure and also ablates some of the growth substrate 102 in area 308. To form the entire array of streets 302, the first laser beam is sequentially scanned across the surface 124 of assembly 700 in the X-direction. Alternatively the first laser beam is held stationary and assembly 700 is scanned.

The next step to form a thick, substrate-free LED chip that has a first upper electrode is to scan a pulsed second laser beam in at least a first direction across and through the growth substrate to form both an interfacial layer of non-uniform thickness between the multilayer semiconductor substrate and the growth substrate and to simultaneously form surface features on the first surface of the multilayer semiconductor structure. By forming an interfacial layer for subsequent growth-substrate removal and by simultaneously forming surface features in one step, this method reduces the number of steps required to fabricate LEDs.

The second laser beam scanning process for assembly 700 to form an interfacial layer for subsequent growth-substrate removal and simultaneously forming surface features is substantially identical to the second laser beam scanning process illustrated in FIGS. 5A and 5B for assembly 100.

Figure 10A:
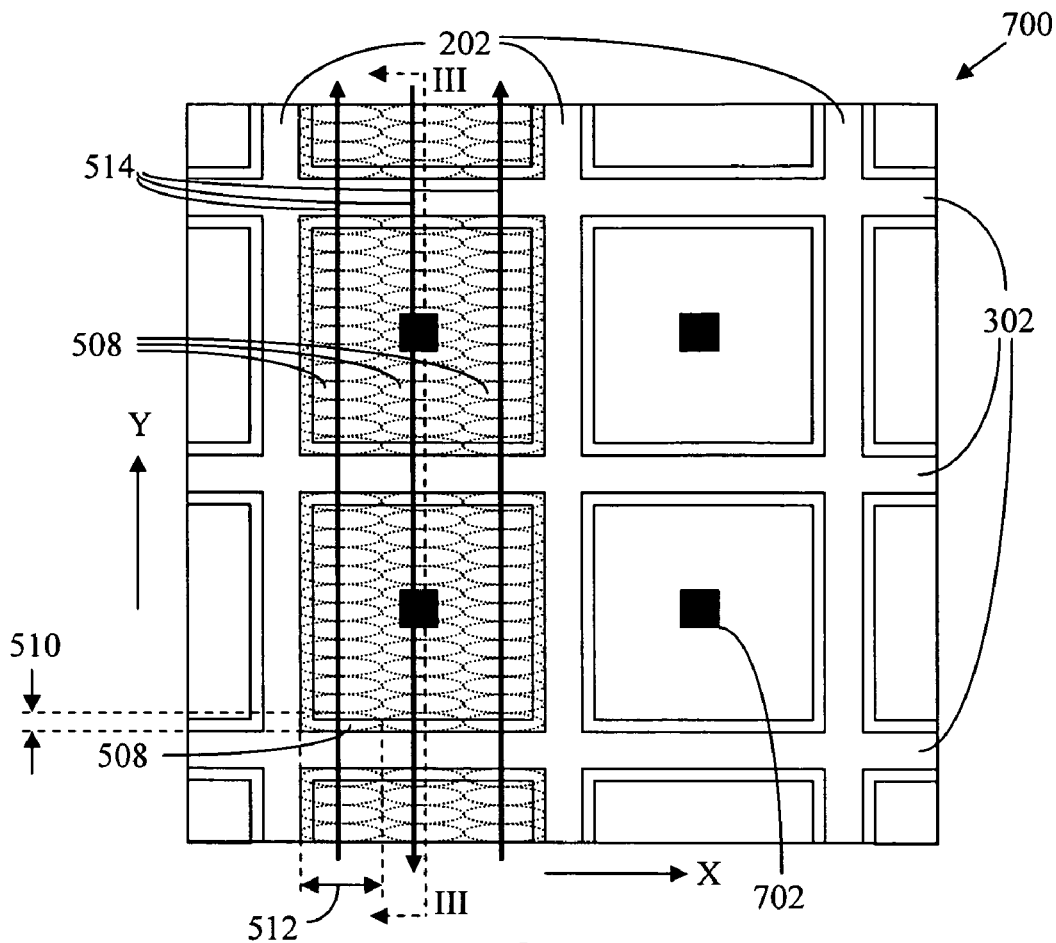
FIG. 10A is top plan view of an assembly of this present invention that illustrates a laser scanning method for simultaneous forming an interfacial layer between a growth substrate and a multilayer semiconductor structure and the formation of surface features on the multilayer semiconductor structure.
Figure 10B:
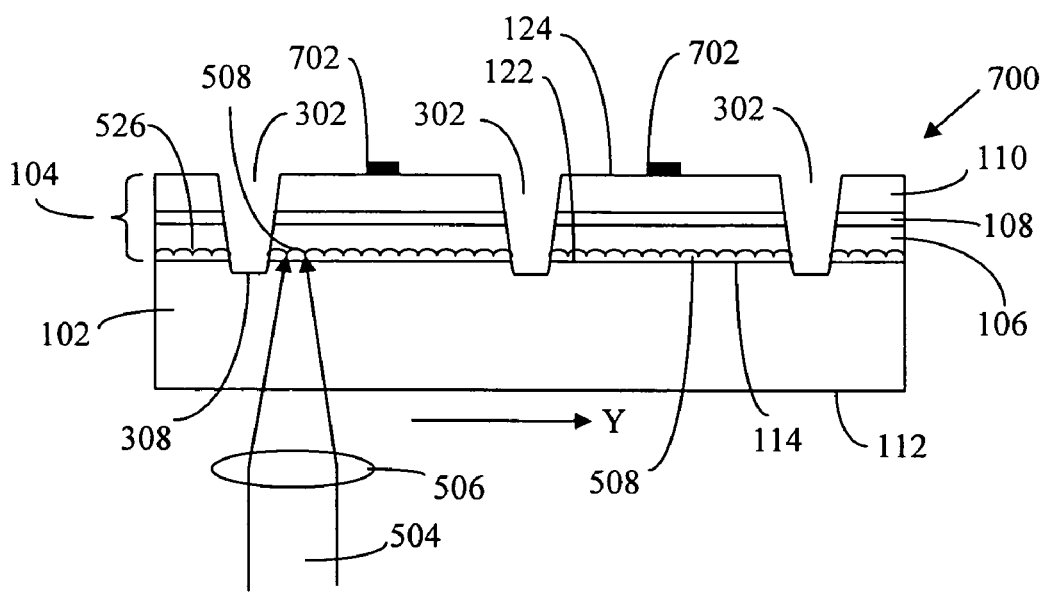
FIG. 10B is cross-sectional side view of the assembly along the III-III plane illustrated in FIG. 10A.

The second laser beam scanning step for assembly 700 is illustrated in FIGS. 10A and 10B. FIGS. 10A and 10B illustrate assembly 700 that includes a growth substrate 102, a multilayer semiconductor structure 104, a first array of first upper electrodes 702, a first array of parallel streets 202 and a second array of parallel streets 302. Three illustrated scans 514 of a pulsed second laser beam 504 in the plus Y and minus Y-directions form both an interfacial layer 508 of non-uniform thickness and form surface features 526 on the lower surface of the multilayer semiconductor structure. FIG. 10A is a top plan view of assembly 700 and FIG. 10B is a side cross-sectional view of the assembly along the III-III plane illustrated in FIG. 10A. The III-III plane is approximately centered on one of the three laser scans.

If desired, the second laser beam scans to form both the interfacial layer and the surface features can be done in both a first direction (the Y-direction in this example) and in a second direction (for example, the X-direction). Scans for the X-direction are not shown in the figures.

Figure 11A:
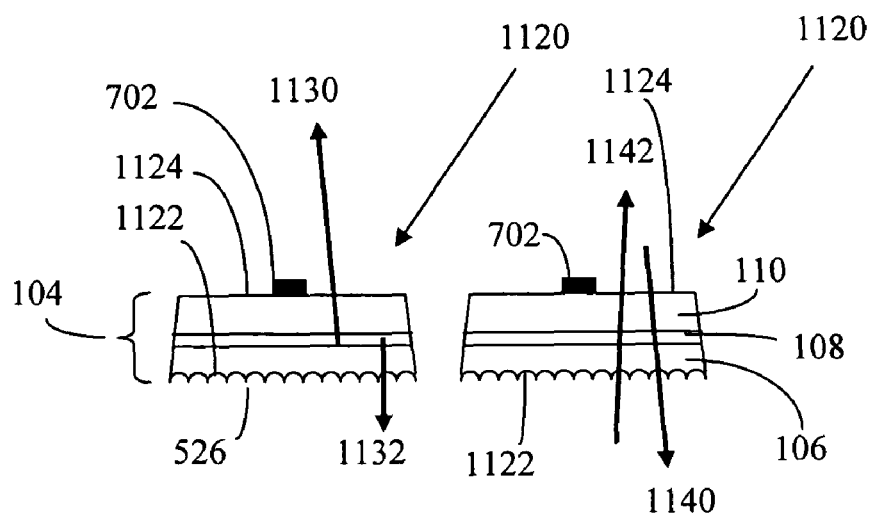
FIG. 11A is side cross-sectional view of substrate-free LEDs having an upper electrode of the present invention.

The next step to form a thick, substrate-free LED chip that has a first upper electrode is to detach the multilayer semiconductor structure from the growth substrate by severing the interfacial layer. The resulting LEDs 1120 are illustrated in FIG. 11A. If the multilayer semiconductor structure is a GaN-based material, the interfacial layer will consist of gallium metal and any nitrogen gas that is trapped in the interfacial layer. In many cases, the LED chips will detach from the growth substrate with no additional processing. Gallium metal has a melting point of approximately 30 degrees Celsius. If the LED chips do not immediately detach from the growth substrate, assembly 700 can be heated to a temperature above 30 degrees Celsius to melt the gallium and allow for easy separation. For example, the heating may be done by placing assembly 700 in hot water with a temperature in excess of 30 degrees Celsius.

The detached structures 1120 are substrate-free LEDs, two of which are illustrated in FIG. 11A. Any residue of gallium metal that remains on the layered semiconductor structure can be removed by a cleaning step (not shown).

Another embodiment of this invention is an LED fabricated by the method illustrated in FIGS. 7 to 11A. An example of this embodiment is LED 1120 illustrated in FIG. 11A. The LEDs 1120 in FIG. 11A have surface features 526 which can act as light extracting elements. The LEDs each have a single first upper electrode 702. The LEDs will emit light if an electrical current is applied between the first upper electrodes 702 and surfaces 1122.

Example light rays 1130 and 1132 in FIG. 11A illustrate the operation of LED 1120. If an electrical voltage is applied between first upper electrode 702 and surface 1122, the active region emits internally generated light. Internally generated light ray 1130 is emitted by the active region 108 in the direction of upper surface 1124 at an angle less than the critical angle. Internally generated light ray 1130 exits LED 1120 through surface 1124. Internally generated light ray 1132 is emitted by the active region 108 in the direction of the lower surface 1122 at an angle less than the critical angle. Internally generated light ray 1132 exits LED 1120 through surface 1122.

LED chips 1120 will transmit externally incident light. Externally incident light is light that is directed to the LED chips from an outside source such as another LED. Externally incident light is illustrated in FIG. 11A by light rays 1140 and 1142. Externally incident light ray 1140 is incident on the upper surface 1124 of LED 1120. Externally incident light ray 1140 passes through the multilayer semiconductor structure 104 and exits LED through lower surface 1122. Externally incident light ray 1142 is incident on the lower surface 1122 of LED 1120. Externally incident light ray 1140 passes through the multilayer semiconductor structure 104 and exits LED through upper surface 1124.

Preferably, LED chip 1120 transmits at least 60 percent of externally incident light that is incident on the upper or lower surface of the LED. More preferably, LED chip 1120 transmits at least 70 of externally incident light. Most preferably, LED chip 1120 transmits at least 80 of externally incident light. High light transmission is important to transmit light emitted from one LED through another LED or to transmit light from a phosphor through the LED.

If desired, either side 1122 or side 1124 of LED 1120 can be bonded onto a metal surface or leadframe. Such a surface or leadframe would also provide a thermal pathway to remove heat from the LED. Preferably such a metal surface or leadframe is a light reflector to reflect any internally generated light to the opposite surface of the LED. If side 1124 is bonded to such a metal surface, preferably first upper electrode 702 covers the entire surface 1124 of the LED and preferably first upper electrode 702 has high reflectivity (greater than 90 percent) to light internally generated by the LED.

Figure 11B:
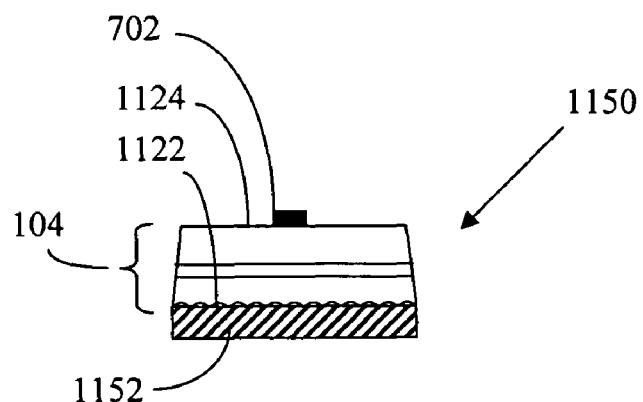
FIG. 11B is side cross-sectional view of a substrate-free LED that includes an upper electrode and a lower electrode of the present invention.
Figure 11C:
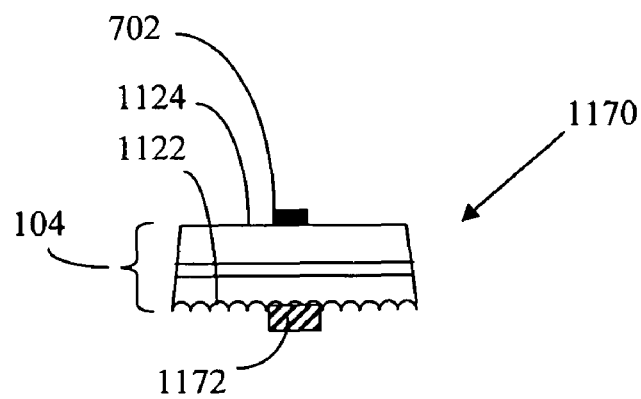
FIG. 11C is side cross-sectional view of another substrate-free LED that includes an upper electrode and a lower electrode of the present invention.

Another embodiment of this invention is a method for fabricating an LED that has a first upper electrode and a lower electrode. Examples of such LEDs are illustrated in FIGS. 11B and 11C. Starting with the method for fabricating an LED 1120 that has a first upper electrode 702 and that is illustrated above in FIGS. 7 to 11A, a lower electrode material is deposited on the bottom surface 1122 of LED 1120. If necessary, the lower electrode material is patterned by lithographic means to form the lower electrode. The lower electrode can be a light reflecting electrode or a light transmitting electrode. Example materials for the lower electrode include, but are not limited to, metals such as gold, aluminum, silver and titanium and transparent conductive oxides (TCOs) including, but not limited to, indium tin oxide (ITO).

FIG. 11B illustrates LED 1150 that has a lower electrode 1152 that covers substantially the entire lower surface 1122 of the LED. LED 1150 will emit light through surface 1124 when a voltage is applied between the first upper electrode 702 and the lower electrode 1152.

FIG. 11C illustrates LED 1170 that has a lower electrode 1172 that only partially covers the lower surface 1122 of the LED. LED 1170 will emit light through both the lower surface 1122 and the upper surface 1124 when a voltage is applied between the first upper electrode 702 and the lower electrode 1172.

LEDs can also be fabricated that each have two upper electrodes. Example methods will be described below.

Another embodiment of this invention is a method to fabricate a thick, substrate-free LED that has two upper electrodes. The first upper electrode is in electrical contact with the second or upper surface of the second doped layer, which is also the second or upper surface of the multilayer semiconductor structure, and the second upper electrode is in electrical contact with the upper surface of the first doped layer. The method is illustrated in FIGS. 12 to 16. The method is nearly identical to the method described above in FIGS. 1 to 3 and FIGS. 5 to 6 for fabricating an LED starting with assembly 100. However, the starting assembly 1200 for the modified method includes both a first array of first upper electrodes 1202 and a second array of second upper electrodes 1204 that are not present in assembly 100.

Figure 12A:
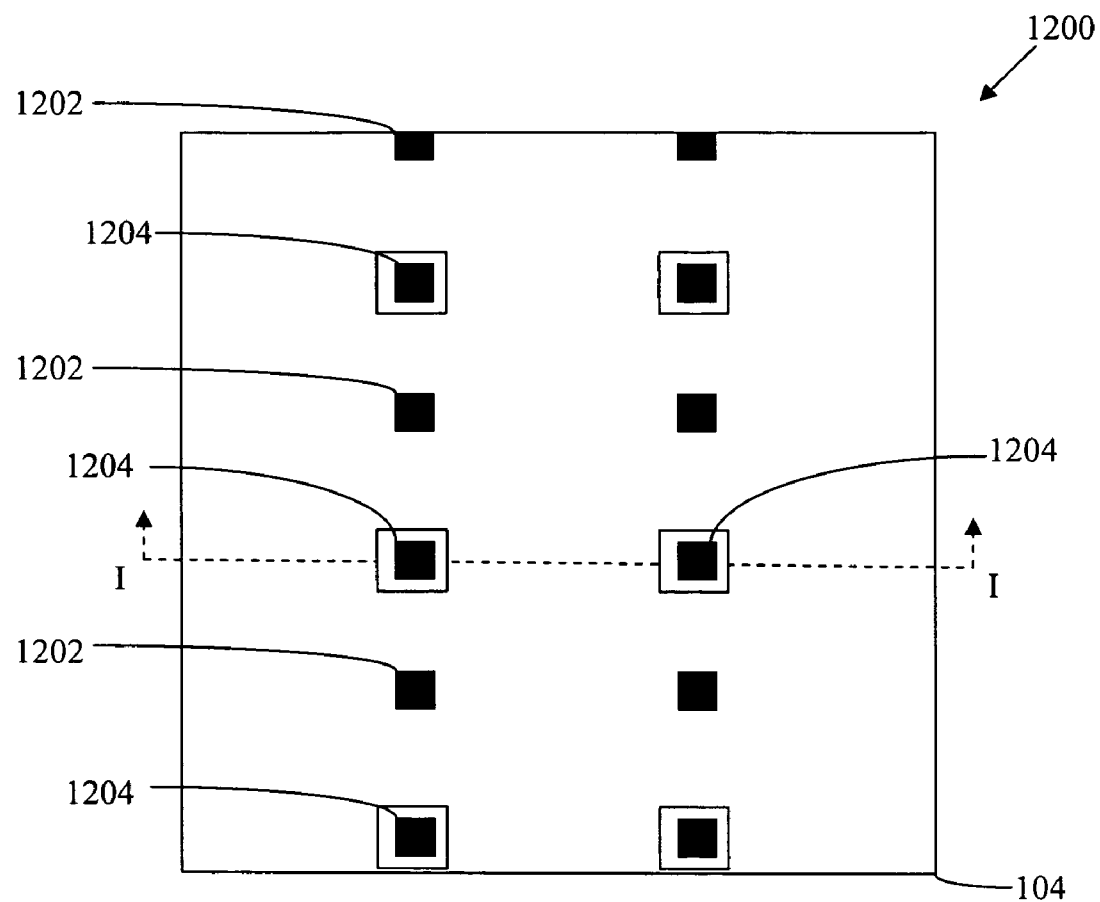
FIG. 12A is top plan view of an assembly of the present invention that includes a growth substrate, a multilayer semiconductor structure and two arrays of upper electrodes.
Figure 12B:
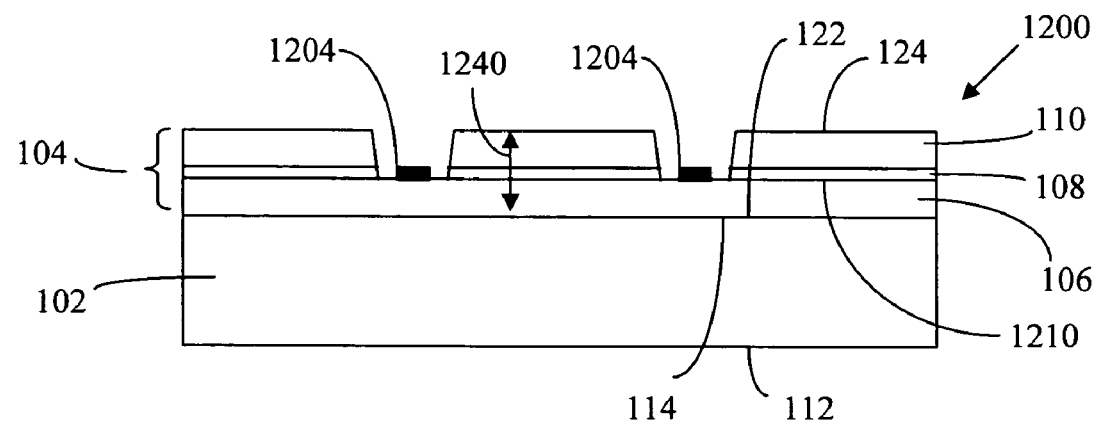
FIG. 12B is cross-sectional side view of the assembly along the I-I plane illustrated in FIG. 12A.

The first step to form a thick, substrate-free LED chip that has two upper electrodes is to provide an assembly 1200 that includes a multilayer semiconductor structure on an optically transparent growth substrate. Assembly 1200 in FIGS. 12 to 16 is identical to assembly 100 in FIGS. 1 to 3 and FIGS. 5 to 6 except that assembly 1200 includes a first array of first upper electrodes 1202 and a second array of second upper electrodes 1204. FIGS. 12A and 12B illustrate assembly 1200 that includes a growth substrate 102, a multilayer semiconductor structure 104, a first array of first upper electrodes 1202 and a second array of second upper electrodes 1204. FIG. 12A is a top plan view of assembly 1200 and FIG. 12B is a side cross-sectional view of the assembly. The growth substrate 102 has a first or lower surface 112 and a second or upper surface 114 opposite the first surface 112. The multilayer semiconductor structure 104 has a first or lower surface 122 and a second or upper surface 124 opposite the first surface 122. The lower surface 122 of the multilayer semiconductor structure is in contact with the upper surface 114 of the growth substrate.

The first array of first upper electrodes 1202 is in electrical contact with the second or upper surface 124 of the second doped layer 110 of the multilayer semiconductor structure. The first upper electrodes 1202 are made from one or more electrically conductive materials. Example materials include, but are not limited to, metals such as gold, aluminum, silver and titanium and transparent conductive oxides such as indium tin oxide (ITO). The array of electrodes 1202 covers only a portion of the second surface of the multilayer semiconductor structure. The electrically conductive materials are deposited by standard deposition techniques and patterned lithographically to form the array.

The second array of second upper electrodes 1204 is in electrical contact with the upper surface 1210 of the first doped layer. In order to place the second upper electrodes 1204 in electrical contact the first doped layer, portions of the second doped layer 110 and the active region 108 must first be removed by a standard lithographic etching process. The thicknesses of the first doped layer 106, the active region 108 and the second doped layer are not drawn to scale in FIGS. 12-16. If the first doped layer is an n-doped layer, normally the n-doped layer is much thicker than the active region and the second doped layer.

The second array of second upper electrodes 1204 is made from one or more electrically conductive materials. Example materials include, but are not limited to, metals such as gold, aluminum, silver and titanium and transparent conductive oxides such as indium tin oxide (ITO). The array of electrodes 1204 covers only a portion of the upper surface of the first doped layer. The electrically conductive materials are deposited by standard deposition techniques and patterned lithographically to form the array. The first array of first upper electrodes and second array of second upper electrodes may be fabricated from the same electrical conductive material and the two arrays may be patterned at the same time in one lithographic step. Although the first array of first upper electrodes and the second array of second upper electrodes are shown to be provided or formed on the multilayer semiconductor structure before any of the etching or liftoff steps are done, it is within the scope of this invention that the first array of first upper electrodes and the second array of second upper electrodes can be formed at any time in the process, including being formed as the last step of the process.

The multilayer semiconductor structure 104 and the growth substrate 102 for assembly 1200 in FIGS. 12 to 16 are identical to the corresponding elements in the previously described assembly 100 illustrated in FIGS. 1 to 3 and FIGS. 5 to 6.

The total thickness 1240 of the multilayer semiconductor structure 104 in assembly 1200 is preferably at least 10 microns. A thickness of at least 10 microns is needed to provide structural rigidity to the structure when it is later removed from the growth substrate. More preferably, the total thickness 1240 of the multilayer semiconductor structure is at least 20 microns. Most preferably, the total thickness 1240 of the multilayer semiconductor structure is at least 30 microns.

The growth substrate 102 can be any substrate upon which the multilayer semiconductor structure 104 can be epitaxially grown. The growth substrate should be transparent to any laser beam utilized for subsequent processing. Sapphire is optically transparent in the 200 to 700 nm wavelength range and is a preferred substrate for this invention.

Optionally a protective layer (not shown) may be applied to the second surface 124 of the multilayer semiconductor structure 104, to the first array of first upper electrodes 1202 and to the second array of second upper electrodes 1204 in order to protect the surfaces from debris from the following etching step. For example, a film of polyvinyl alcohol and water may be spin coated onto the second surface 124 and dried to form a protective layer.

Figure 13A:
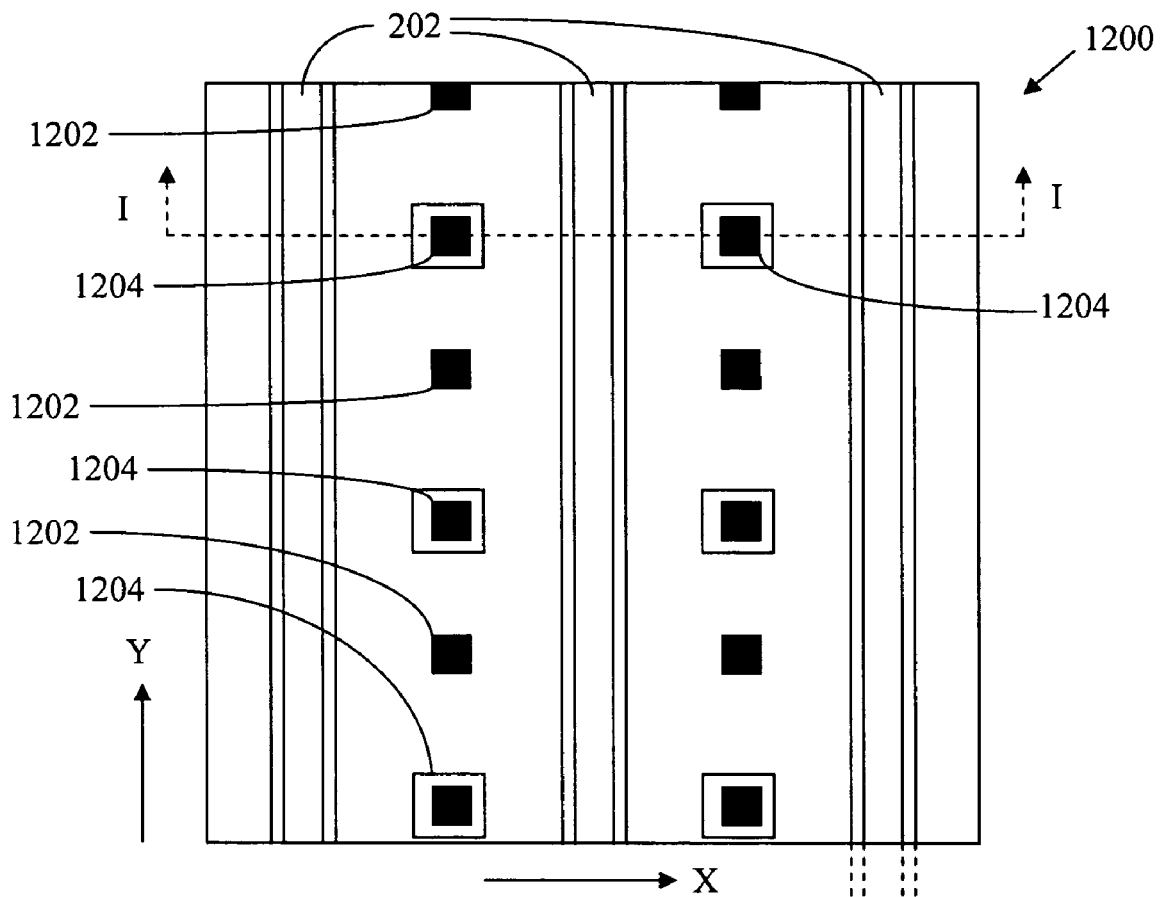
FIG. 13A is top plan view of an assembly of this present invention that illustrates a first array of parallel streets.
Figure 13B:
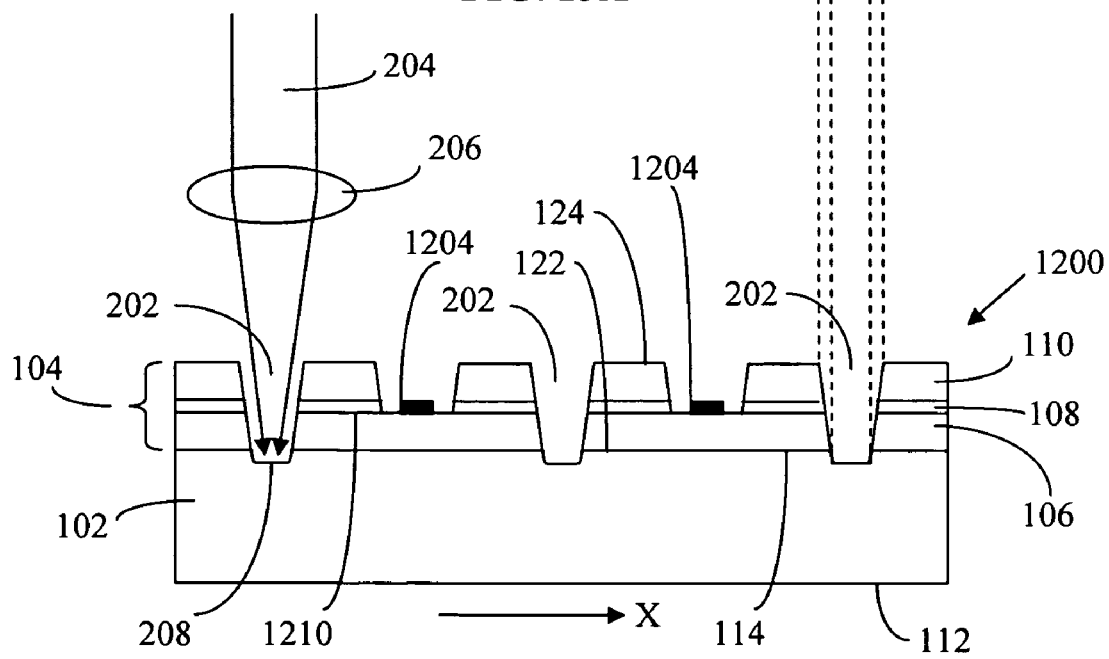
FIG. 13B is cross-sectional side view of the assembly along the I-I plane illustrated in FIG. 13A.

The next step to form a thick, substrate-free LED chip that has two upper electrodes is to etch a first array of parallel streets through the multilayer semiconductor structure. FIGS. 13A and 13B illustrate assembly 1200 that includes a growth substrate 102, a multilayer semiconductor structure 104, a first array of first upper electrodes 1202, a second array of second upper electrodes 1204 and a first array of parallel streets 202 that are laser etched through the multilayer semiconductor structure in the Y-direction. FIG. 13A is a top plan view of assembly 1200 with a first array of parallel streets 202 and FIG. 13B is a side cross-sectional view of the assembly along the I-I plane illustrated in FIG. 13A.

Etching to form the first array of parallel streets 202 can be done using a laser ablation process and a pulsed first laser beam and has been described above for FIGS. 2A and 2B. Preferably, the etching process goes through substantially the entire thickness of the multilayer semiconductor structure. Alternatively, the etching process may go entirely through the multilayer semiconductor structure and also ablate some of the growth substrate 102 in area 208 as illustrated in FIG. 13B. To form the entire array of parallel streets 202, the first laser beam is sequentially scanned across the surface 124 of assembly 1200 in the Y-direction. Alternatively the laser beam is held stationary and assembly 1200 is scanned.

Figure 14A:
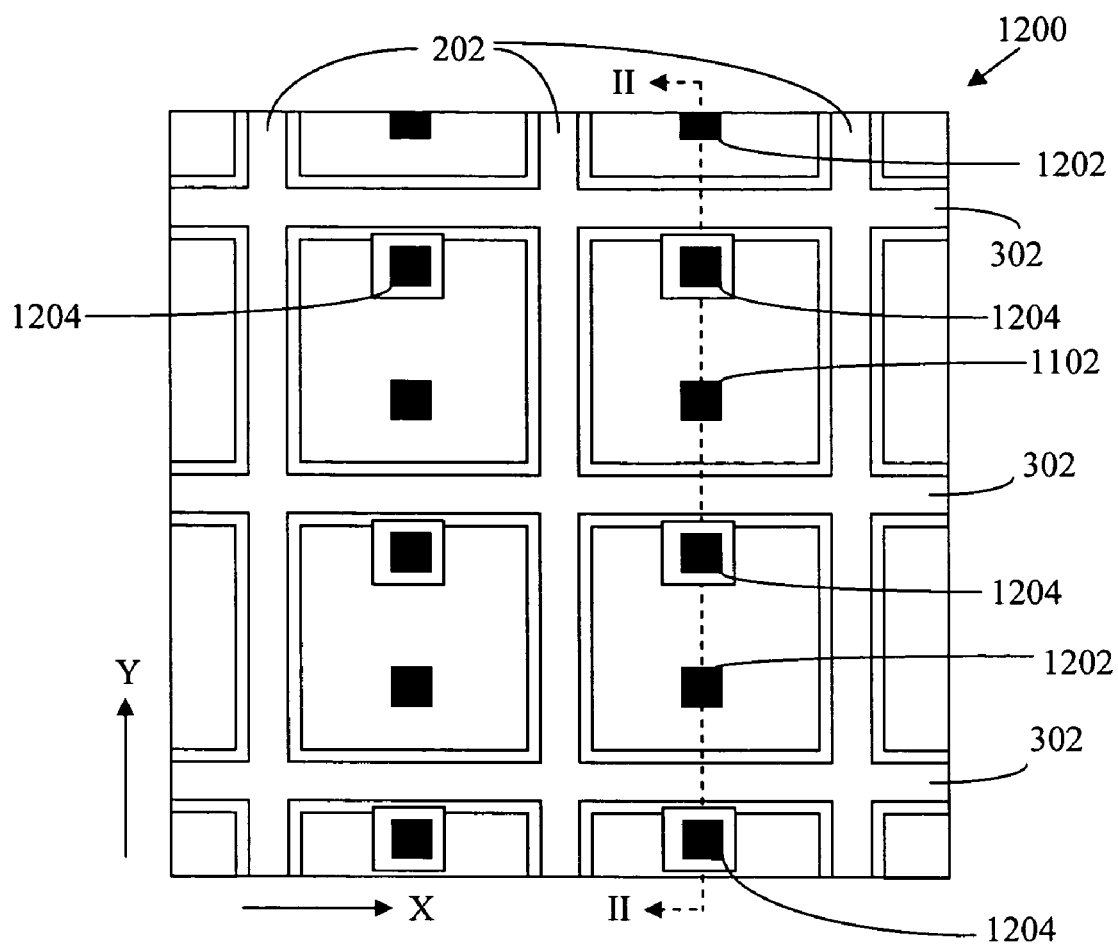
FIG. 14A is top plan view of an assembly of this present invention that illustrates both a first array of parallel streets and an optional second array of parallel streets.
Figure 14B:
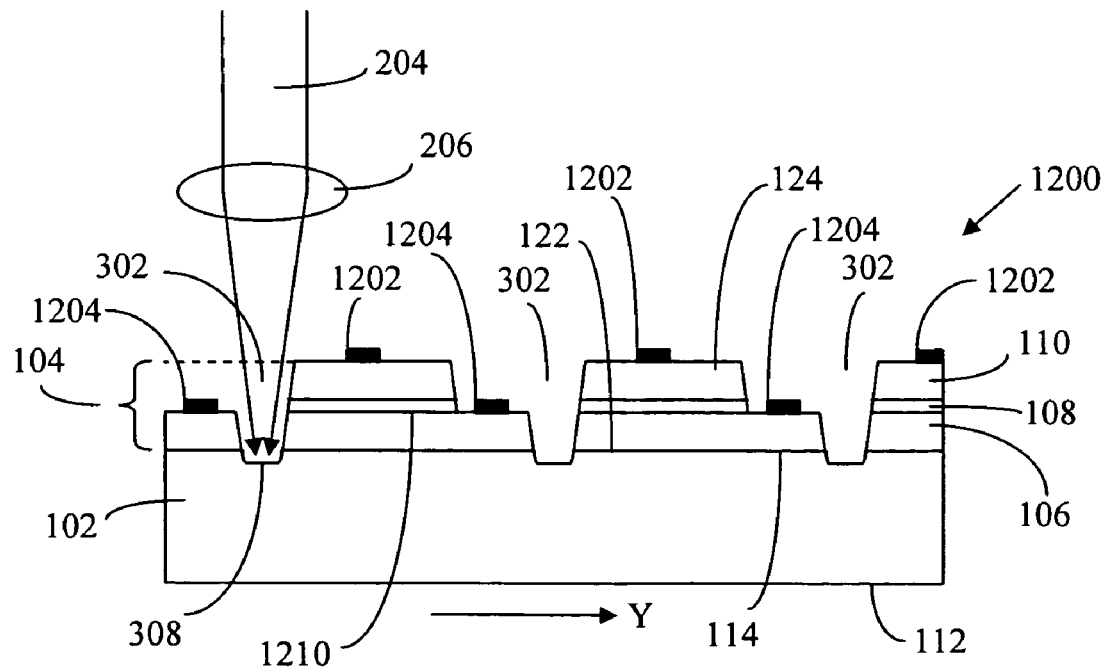
FIG. 14B is cross-sectional side view of the assembly along the II-II plane illustrated in FIG. 14A.

An optional step to form a thick, substrate-free LED chip that has two upper electrodes is to etch a second array of parallel streets through the multilayer semiconductor structure in a second direction. FIGS. 14A and 14B illustrate assembly 1200 that includes a growth substrate 102, a multilayer semiconductor structure 104, a first array of first upper electrodes 1202, a second array of second upper electrodes 1204, a first array of parallel streets 202 and a second array of parallel streets 302 that are laser etched through the multilayer semiconductor structure. FIG. 14A is a top plan view of assembly 1200 illustrating two perpendicular arrays of streets and FIG. 14B is a side cross-sectional view of the assembly along the II-II plane illustrated in FIG. 14A.

The second direction for the second array of parallel streets 302 can be at any angle to the first direction for the first array of parallel streets 202. In FIG. 14A, the second direction is substantially perpendicular to the first direction. The second direction is the X-direction and the first direction is the Y-direction.

Etching to form the second array of parallel streets 302 can be done using a laser ablation process and a pulsed first laser. The laser etching process for assembly 1200 is identical to the etching process illustrated above in FIGS. 3A and 3B for assembly 100. Preferably, the etching process goes through substantially the entire thickness of the multilayer semiconductor structure. Alternatively, the laser ablation goes through the entire thickness of the multilayer semiconductor structure and also ablates some of the growth substrate 102 in area 308. To form the entire array of streets 302, the laser beam is sequentially scanned across the surface 124 of assembly 1200 in the X-direction. Alternatively the laser beam is held stationary and assembly 1200 is scanned.

The next step to form a thick, substrate-free LED chip that has two upper electrodes is to scan a pulsed second laser beam in at least a first direction across and through the growth substrate to form both an interfacial layer of non-uniform thickness between the multilayer semiconductor substrate and the growth substrate and to simultaneously form surface features on the first surface of the multilayer semiconductor structure. The laser scanning process for assembly 1200 to form an interfacial layer for subsequent growth-substrate removal and simultaneously forming surface features is identical to the laser scanning process illustrated in FIGS. 5A and 5B for assembly 100.

Figure 15A:
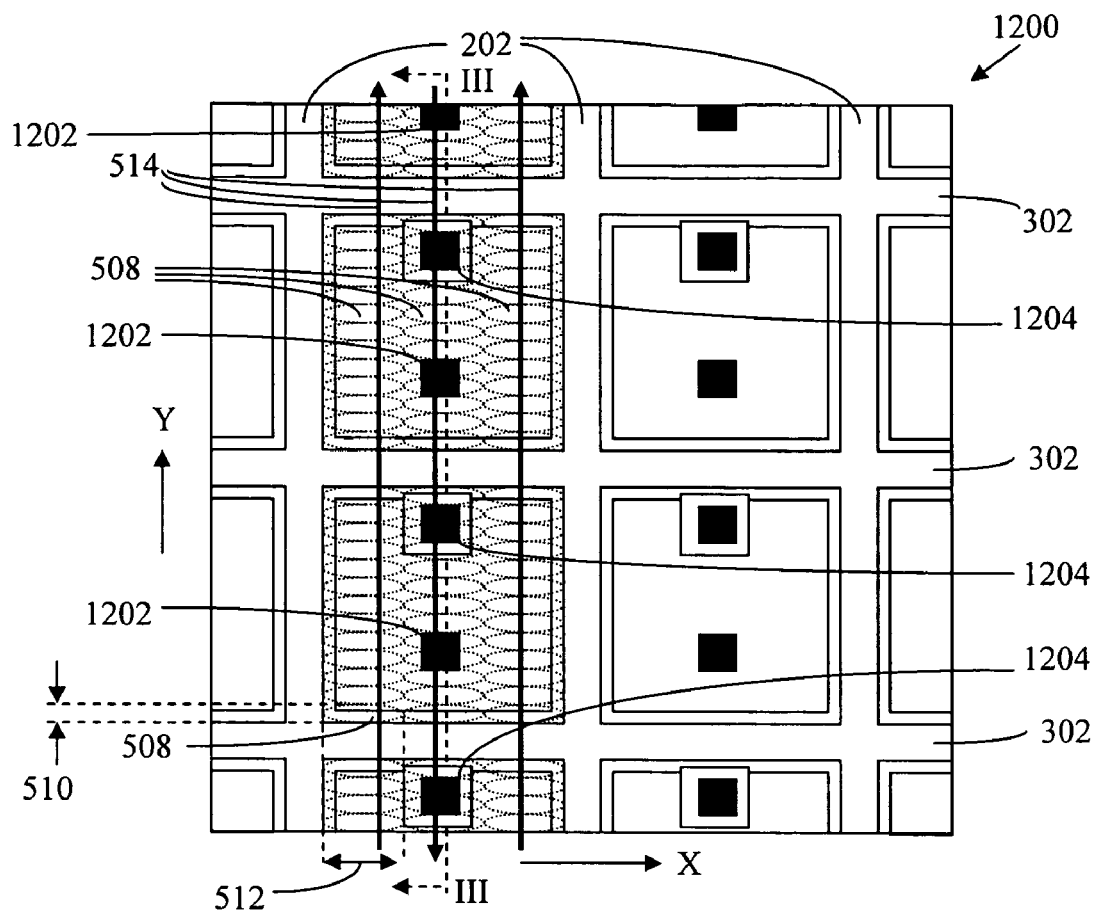
FIG. 15A is top plan view of an assembly of this present invention that illustrates a laser scanning method for simultaneous forming an interfacial layer between a growth substrate and a multilayer semiconductor structure and the formation of surface features on the multilayer semiconductor structure.
Figure 15B:
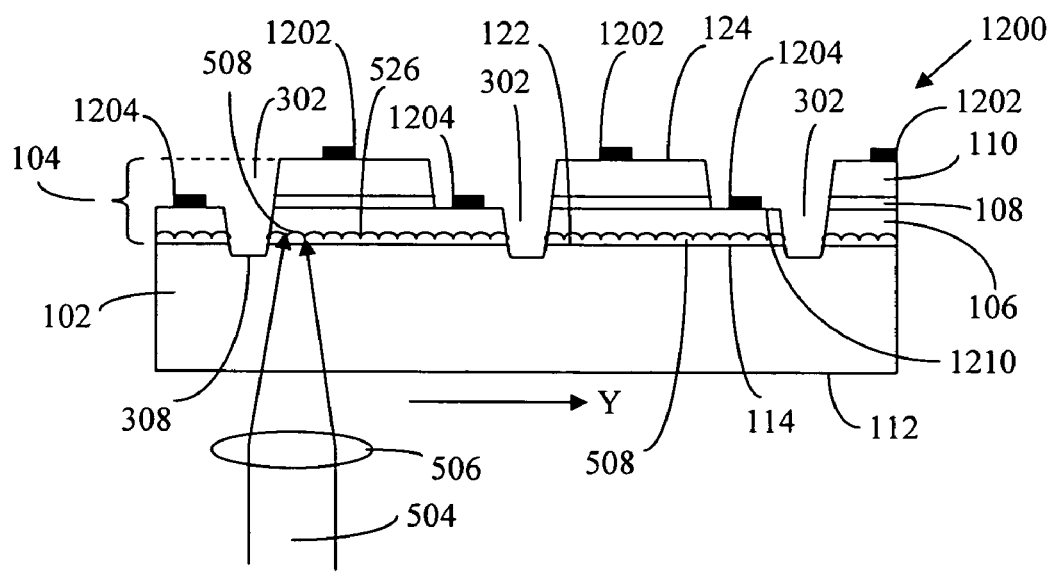
FIG. 15B is cross-sectional side view of the assembly along the III-III plane illustrated in FIG. 15A.

The scanning step is illustrated in FIGS. 15A and 15B. FIGS. 15A and 15B illustrate assembly 1200 that includes a growth substrate 102, a multilayer semiconductor structure 104, a first array of first upper electrodes 1202, a second array of second upper electrodes 1204, a first array of parallel streets 202 and a second array of parallel streets 302. Three illustrated scans 514 of a pulsed second laser beam 504 in the plus Y and minus Y-directions form both an interfacial layer 508 of non-uniform thickness and form surface features 526 on the lower surface of the multilayer semiconductor structure. FIG. 15A is a top plan view of assembly 1200 and FIG. 15B is a side cross-sectional view of the assembly along the III-III plane illustrated in FIG. 15A. The III-III plane is approximately centered on one of the three laser scans.

If desired, laser scans to form both the interfacial layer and the surface features can be done in both a first direction (the Y-direction in this example) and in a second direction (for example, the X-direction). Scans for the X-direction are not shown in the figures.

The next step to form a thick, substrate-free LED chip that has two upper electrodes is to detach the multilayer semiconductor structure from the growth substrate by severing the interfacial layer. If the multilayer semiconductor structure is a GaN-based material, the interfacial layer will consist of gallium metal and any nitrogen gas that is trapped in the interfacial layer. In many cases, the LED chips will detach from the growth substrate with no additional processing. If the LED chips do not immediately detach from the growth substrate, assembly 1200 can be heated to a temperature above 30 degrees Celsius to melt the gallium and allow for easy separation. For example, the heating may be done by placing assembly 1200 in hot water with a temperature in excess of 30 degrees Celsius.

Figure 16:
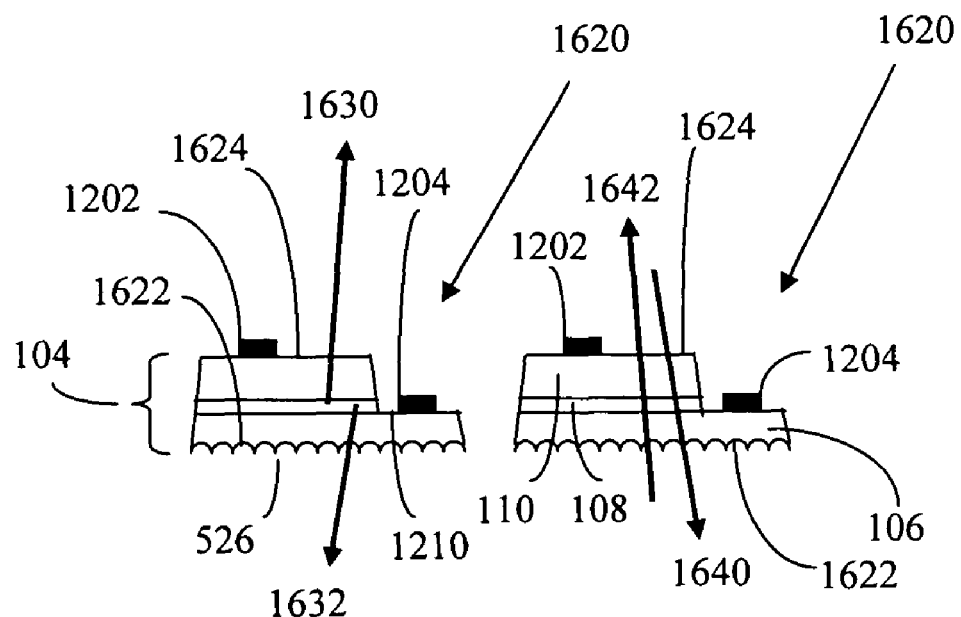
FIG. 16 is side cross-sectional view of two substrate-free LEDs having two upper electrodes illustrating light emission and light transmission through the light emitting diode of the present invention.

The detached structures 1620 are substrate-free LEDs, two of which are illustrated in FIG. 16. Any residue of gallium metal that remains on the layered semiconductor structure can be removed by a cleaning step (not shown).

Another embodiment of this invention is an LED fabricated by the method illustrated in FIGS. 12-16. An example of this embodiment is LED 1620 illustrated in FIG. 16. The LEDs 1620 have surface features 526 which can act as light extracting elements. The LEDs each have a first upper electrode 1202 and a second upper electrode 1204. The LEDs will emit light if an electrical current is applied between electrodes 1202 and electrode 1204.

Example light rays 1630 and 1632 in FIG. 16 illustrate the operation of LED 1620. If an electrical voltage is applied between first upper electrode 1202 and second upper electrode 1204, the active region emits internally generated light. Internally generated light ray 1630 is emitted by the active region 108 in the direction of upper surface 1624 at an angle less than the critical angle. Internally generated light ray 1630 exits LED 1620 through surface 1624. Internally generated light ray 1632 is emitted by the active region 108 in the direction of the lower surface 1622 at an angle less than the critical angle. Internally generated light ray 1632 exits LED 1620 through surface 1622.

LED chips 1620 will transmit externally incident light. Externally incident light is light that is directed to the LED chips from an outside source such as another LED. Externally incident light is illustrated in FIG. 16 by light rays 1640 and 1642. Externally incident light ray 1640 is incident on the upper surface 1624 of LED 1620. Externally incident light ray 1640 passes through the multilayer semiconductor structure 104 and exits LED through lower surface 1622. Externally incident light ray 1642 is incident on the lower surface 1622 of LED 1620. Externally incident light ray 1642 passes through the multilayer semiconductor structure 104 and exits LED through upper surface 1624.

Preferably, LED chip 1620 transmits at least 60 percent of externally incident light that is incident on the upper or lower surface of the LED. More preferably, LED chip 1620 transmits at least 70 of externally incident light. Most preferably, LED chip 1620 transmits at least 80 of externally incident light. High light transmission is important to transmit light emitted from one LED through another LED or to transmit light from a phosphor through the LED.

If desired, side 1622 of LED 1620 can be bonded onto a metal surface or leadframe. Such a surface or leadframe would also provide a thermal pathway to remove heat from the LED. Preferably such a metal surface is a light reflector to reflect any internally generated light to the opposite surface of the LED.

Figure 17:
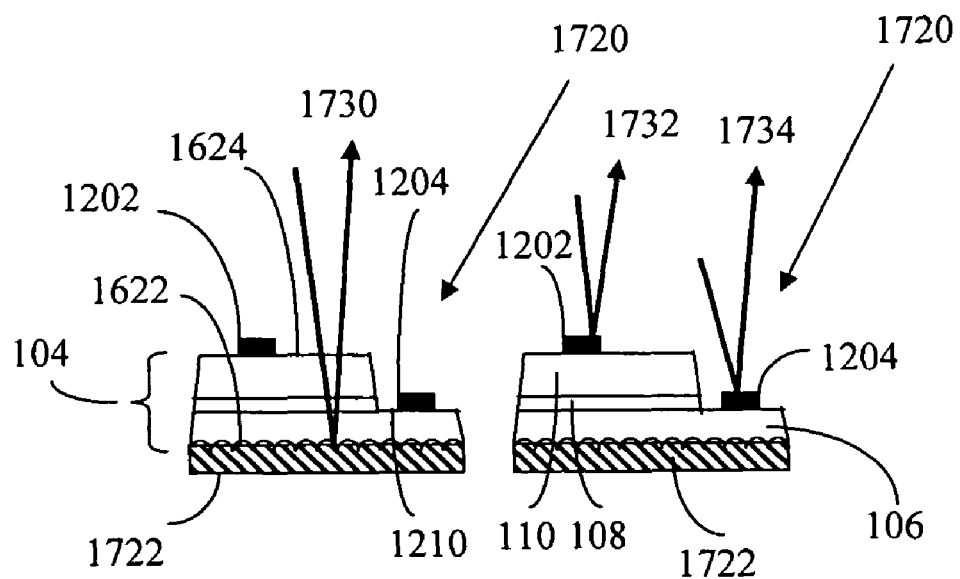
FIG. 17 is side cross-sectional view of substrate-free LEDs having two upper electrodes and a lower light reflecting layer illustrating light reflection in the light emitting diode of the present invention.

Another embodiment of this invention is a method for fabricating an LED that has a first upper electrode, a second upper electrode and a lower light reflecting layer. Such an LED is illustrated in FIG. 17. Starting with the method for fabricating an LED that has a first upper electrode 1202 and a second upper electrode 1204 and that is illustrated in FIGS. 12 to 16, a reflecting layer 1722 is deposited on the bottom surface 1622 of the LED. The reflecting layer 1722 can be a metal layer or an omnidirectional mirror that includes a metal layer and a dielectric layer. The resulting LED, designated as LED 1720 in FIG. 17, will emit internally generated light from the upper surface 1624 when a voltage is applied between the first upper electrode 1202 and the second upper electrode 1204.

In addition to emitting internally generated light, LED 1720 will reflect externally incident light. Externally incident light is light that is directed to the LED from another light source. Light rays 1730, 1732 and 1734 in FIG. 17 illustrate examples of externally incident light rays that are reflected by LED 1720.

Externally incident light ray 1730 is incident on the second or upper surface 1624 of the multilayer semiconductor structure 104. Externally incident light ray 1730 passes through surface 1624, passes through the multilayer semiconductor structure a first time, is reflected by the reflecting layer 1722, passes through the multilayer semiconductor structure a second time and exits LED 1730 through surface 1624.

Externally incident light ray 1732 is incident on the first upper electrode 1202 and is reflected by the electrode. Externally incident light ray 1734 is incident on the second upper electrode 1204 and is reflected by the electrode.

For some LED applications that utilize light recycling, it is desirable that the reflectivity of an LED to externally incident light be at least 60 percent. More preferably, the reflectivity of the LED to externally incident light should be at least 70 percent. Most preferably, the reflectivity of the LED to externally incident light should be at least 80 percent. If the reflectivity of the LED to externally incident light is not uniform across the upper surface of the LED, then the reflectivity of the LED refers to the average reflectivity across the upper surface of the LED.

Another embodiment of this invention is a method for fabricating a thick LED that has a first upper electrode and a second upper electrode and where the multilayer semiconductor structure includes a substantially undoped semiconductor layer. The first upper electrode is in electrical contact with the second or upper surface of the second doped layer, which is also the second or upper surface of the multilayer semiconductor structure, and the second upper electrode is in electrical contact with the upper surface of the first doped layer. The method is illustrated in FIGS. 18 to 22. The method is nearly identical to the method described above in FIGS. 1 to 3 and FIGS. 5 to 6 for fabricating an LED starting with assembly 100. However, the starting assembly 1800 for the modified method includes both a first array of first upper electrodes 1202 and a second array of second upper electrodes 1204 that are not present in assembly 100. Furthermore, the multilayer semiconductor structure 104 includes a substantially undoped semiconductor layer 1850 that is not present in assembly 100.

The first step to form a thick, substrate-free LED chip that has two electrodes is to provide an assembly 1800 that includes a multilayer semiconductor structure on an optically transparent growth substrate. The multilayer semiconductor structure includes a substantially undoped layer 1850. The undoped semiconductor layer has a first or lower surface 1852 that corresponds to the first or lower surface 122 of the multilayer semiconductor structure and a second or upper surface 1854 that is in contact with the first or lower surface of the first doped layer 106.

Figure 18A:
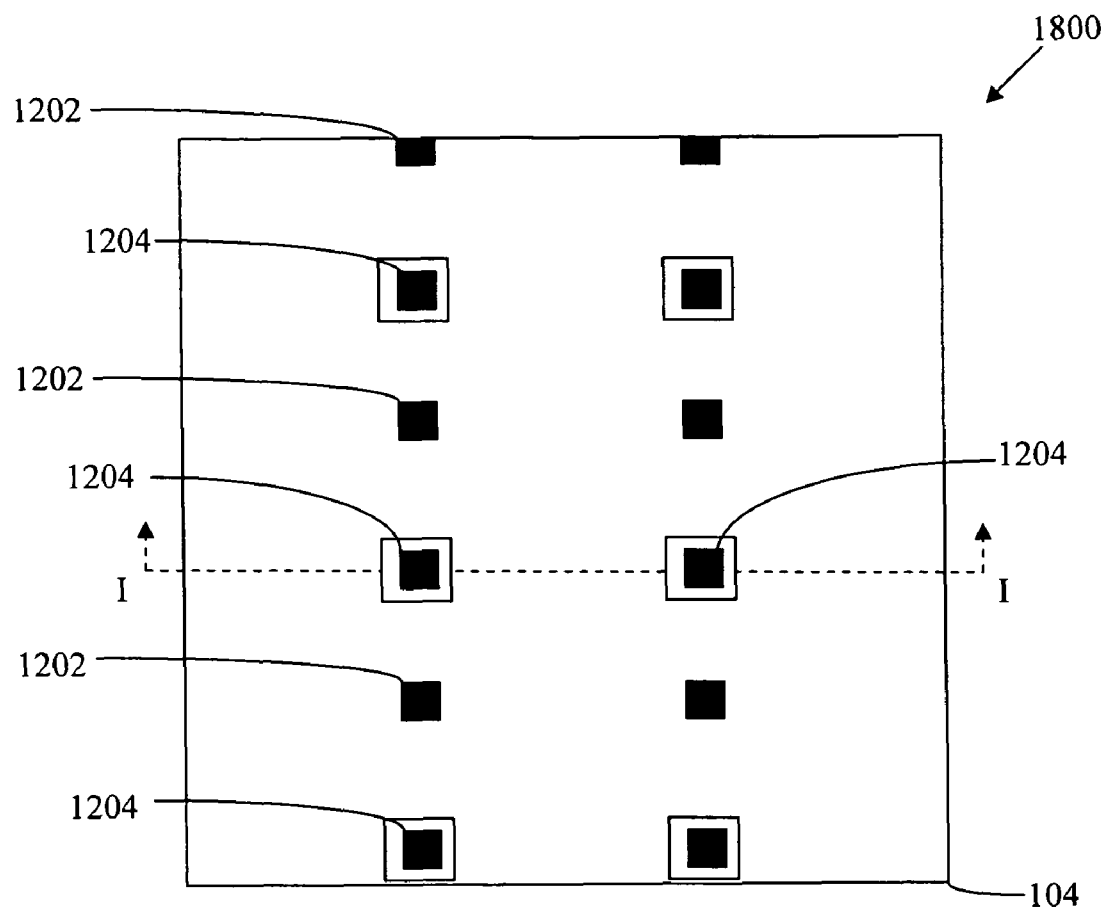
FIG. 18A is top plan view of an assembly of the present invention that includes a growth substrate, a multilayer semiconductor structure that has a substantially undoped layer and two arrays of upper electrodes.
Figure 18B:
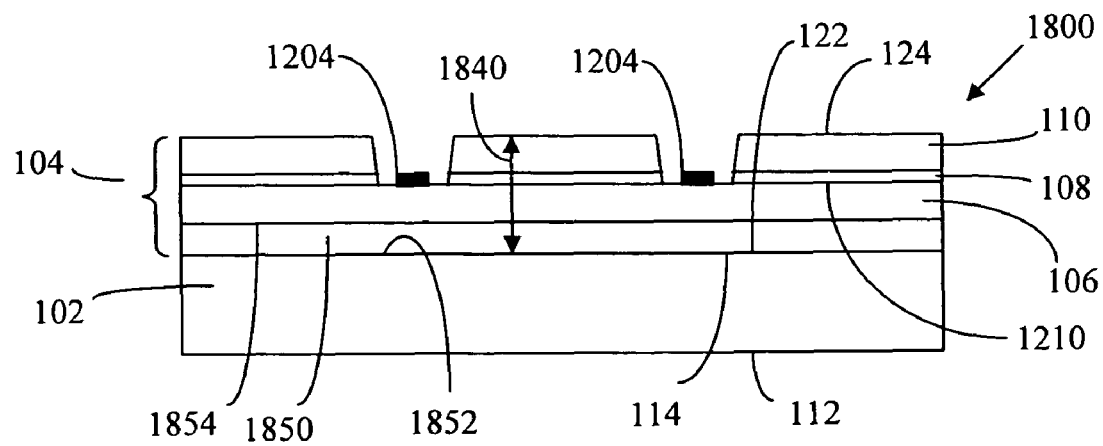
FIG. 18B is cross-sectional side view of the assembly along the I-I plane illustrated in FIG. 18A.

FIGS. 18A and 18B illustrate assembly 1800 that includes a growth substrate 102, a multilayer semiconductor structure 104 that includes a substantially undoped layer 1850, a first array of first upper electrodes 1202 and a second array of second upper electrodes 1204. FIG. 18A is a top plan view of assembly 1800 and FIG. 18B is a side cross-sectional view of the assembly. The growth substrate 102 has a first or lower surface 112 and a second or upper surface 114 opposite the first surface 112. The multilayer semiconductor structure 104 has a first or lower surface 122 and a second or upper surface 124 opposite the first surface 122. The lower surface 122 of the multilayer semiconductor structure is in contact with the upper surface 114 of the growth substrate.

The first array of first upper electrodes 1202 is in electrical contact with the second or upper surface 124 of the multilayer semiconductor structure. The first upper electrodes 1202 are made from one or more electrically conductive materials. Example materials include, but are not limited to, metals such as gold, aluminum, silver and titanium and transparent conductive oxides such as indium tin oxide (ITO). The array of first upper electrodes 1202 covers only a portion of the second surface of the multilayer semiconductor structure. The electrically conductive materials are deposited by standard deposition techniques and patterned lithographically to form the array.

The second array of second upper electrodes 1204 is in electrical contact with the upper surface 1210 of the first doped layer. In order to place the second upper electrodes 1204 in electrical contact the first doped layer, portions of the second doped layer 110 and the active region 108 must first be removed by a standard lithographic etching process. The thicknesses of the first doped layer 106, the active region 108, the second doped layer and the undoped layer 1850 are not drawn to scale in FIGS. 18-22.

The second array of second upper electrodes 1204 is made from one or more electrically conductive materials. Example materials include, but are not limited to, metals such as gold, aluminum, silver and titanium and transparent conductive oxides such as indium tin oxide (ITO). The array of electrodes 1204 covers only a portion of the upper surface of the first doped layer. The electrically conductive materials are deposited by standard deposition techniques and patterned lithographically to form the array. The first array of first upper electrodes and second array of second upper electrodes may be fabricated from the same electrical conductor and the two arrays may be patterned at the same time in one lithographic step.

The growth substrate 102 for assembly 1800 in FIGS. 18 to 22 is identical to the corresponding element in the previously described assembly 100 illustrated in FIGS. 1 to 3 and FIGS. 5 to 6. However, the multilayer semiconductor structure 104 in assembly 1800 includes an undoped layer 1850 that was not present in assembly 100.

The total thickness 1840 of the multilayer semiconductor structure 104 in assembly 1800 includes the thickness of the undoped layer 1850. The total thickness 1840 is preferably at least 10 microns. A thickness of at least 10 microns is needed to provide structural rigidity to the structure when it is later removed from the growth substrate. More preferably, the total thickness 1840 of the multilayer semiconductor structure is at least 20 microns. Most preferably, the total thickness 1840 of the multilayer semiconductor structure is at least 30 microns. In this embodiment the undoped layer may be thicker than the first doped layer, the active region and the second doped layer. For example, if the multilayer semiconductor structure is 30 microns thick and the undoped layer is 27 microns thick, then the remaining three layers will total 3 microns in thickness.

The growth substrate 102 can be any substrate upon which the multilayer semiconductor structure 104 can be epitaxially grown. The growth substrate should be transparent to any laser beam utilized for subsequent processing. Sapphire is optically transparent in the 200 to 700 nm wavelength range and is a preferred substrate for this invention.

Optionally a protective layer (not shown) may be applied to the second surface 124 of the multilayer semiconductor structure 104, to the first array of first upper electrodes 1202 and to the second array of second upper electrodes 1204 in order to protect the surfaces from debris from the following etching step. For example, a film of polyvinyl alcohol and water may be spin coated onto the second surface 124 and dried to form a protective layer.

Figure 19A:
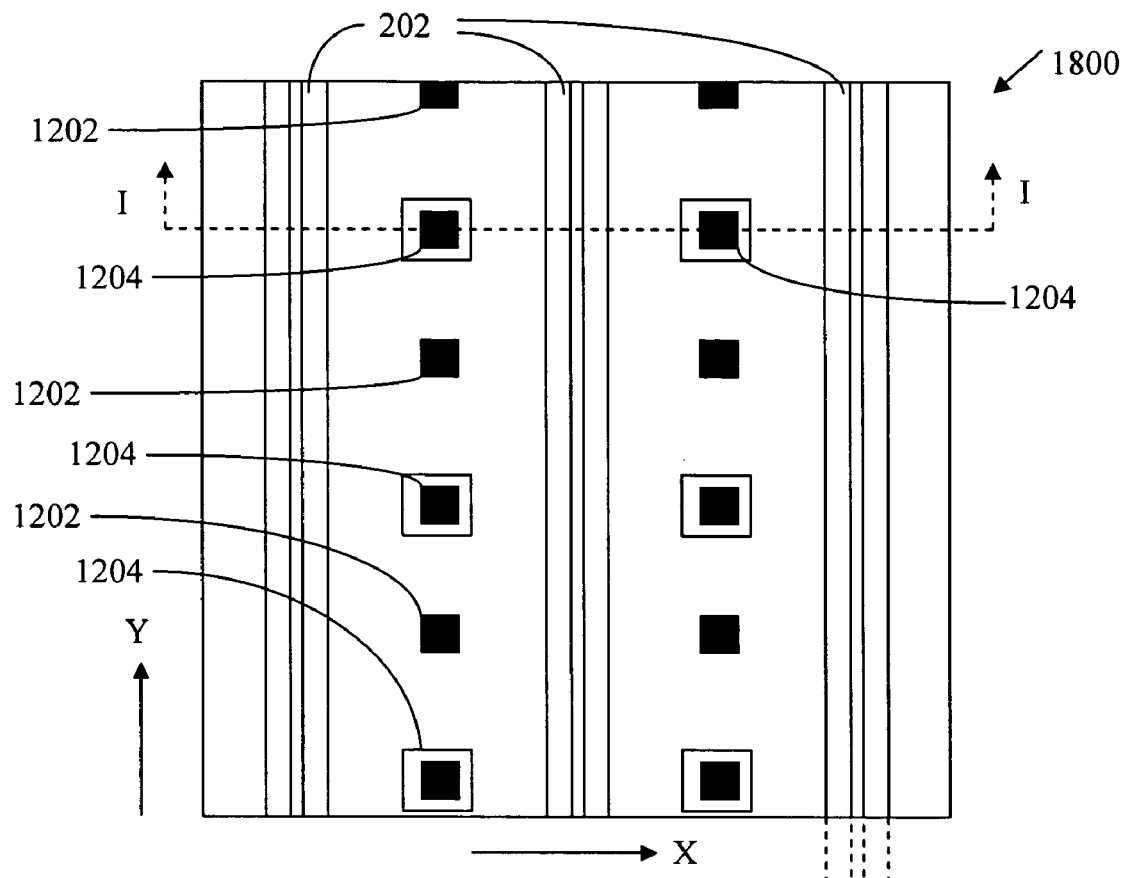
FIG. 19A is top plan view of an assembly of this present invention that illustrates a first array of parallel streets.
Figure 19B:
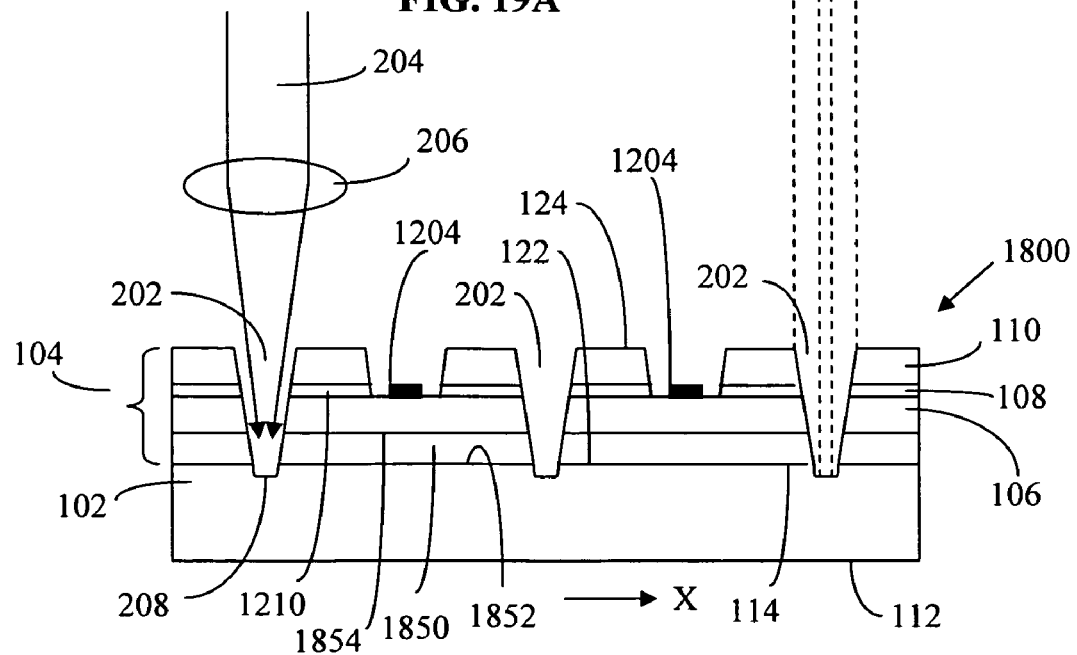
FIG. 19B is cross-sectional side view of the assembly along the I-I plane illustrated in FIG. 19A.

The next step to form a thick, substrate-free LED chip that has two upper electrodes and that has an undoped layer in the multilayer semiconductor structure is to etch a first array of parallel streets through the multilayer semiconductor structure. FIGS. 19A and 19B illustrate assembly 1800 that includes a growth substrate 102, a multilayer semiconductor structure 104, a first array of first upper electrodes 1202, a second array of second upper electrodes 1204 and a first array of parallel streets 202 that are laser etched through the multilayer semiconductor structure in the Y-direction. FIG. 19A is a top plan view of assembly 1800 with a first array of parallel streets 202 and FIG. 19B is a side cross-sectional view of the assembly along the I-I plane illustrated in FIG. 19A.

Etching to form the first array of parallel streets 202 can be done using a laser ablation process and a pulsed first laser beam and has been described above for FIGS. 2A and 2B. Preferably, the etching process goes substantially through the entire thickness of the multilayer semiconductor structure, including the substantially undoped layer 1850. Alternatively, the etching process may go entirely through the multilayer semiconductor structure and also ablate some of the growth substrate 102 in area 208 as illustrated in FIG. 19B. To form the entire array of streets 202, the first laser beam is sequentially scanned across the surface 124 of assembly 1800 in the Y-direction. Alternatively the laser beam is held stationary and assembly 1800 is scanned.

Figure 20A:
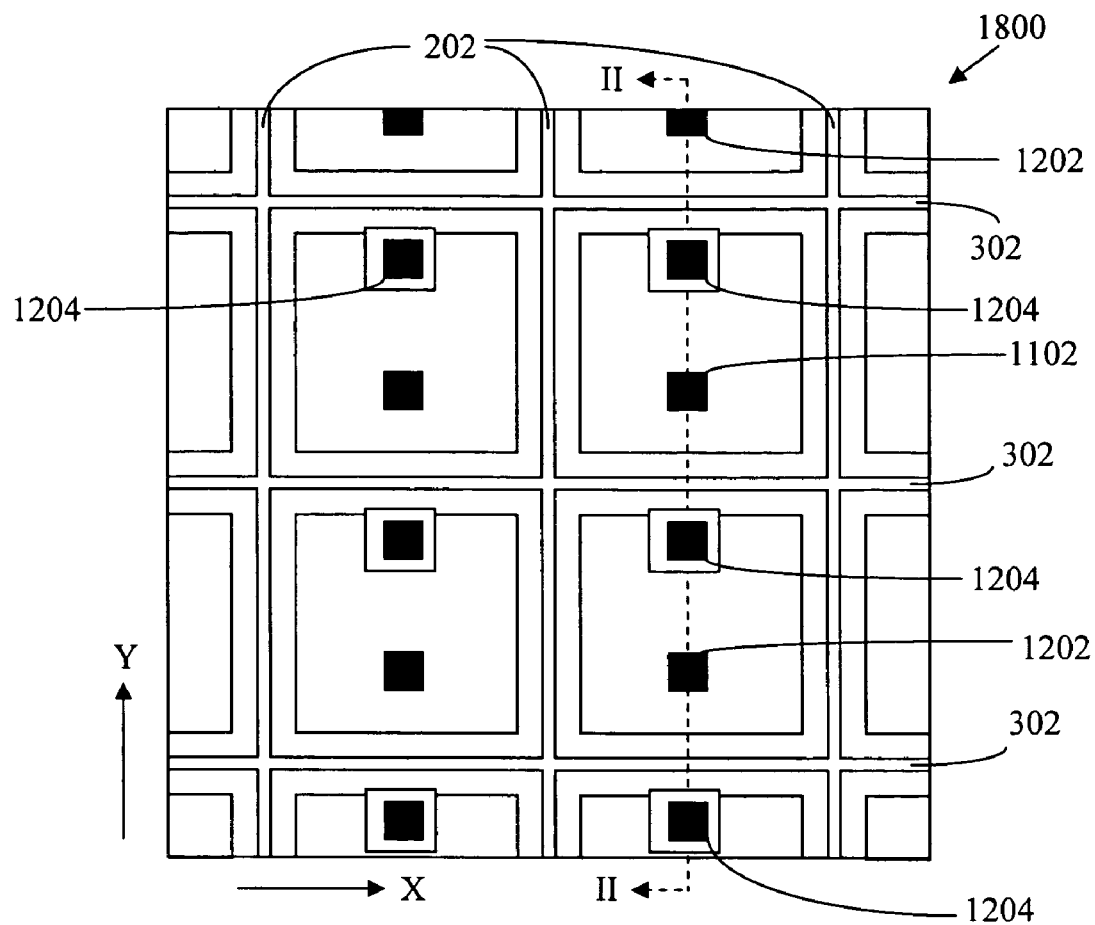
FIG. 20A is top plan view of an assembly of this present invention that illustrates both a first array of parallel streets and an optional second array of parallel streets.
Figure 20B:
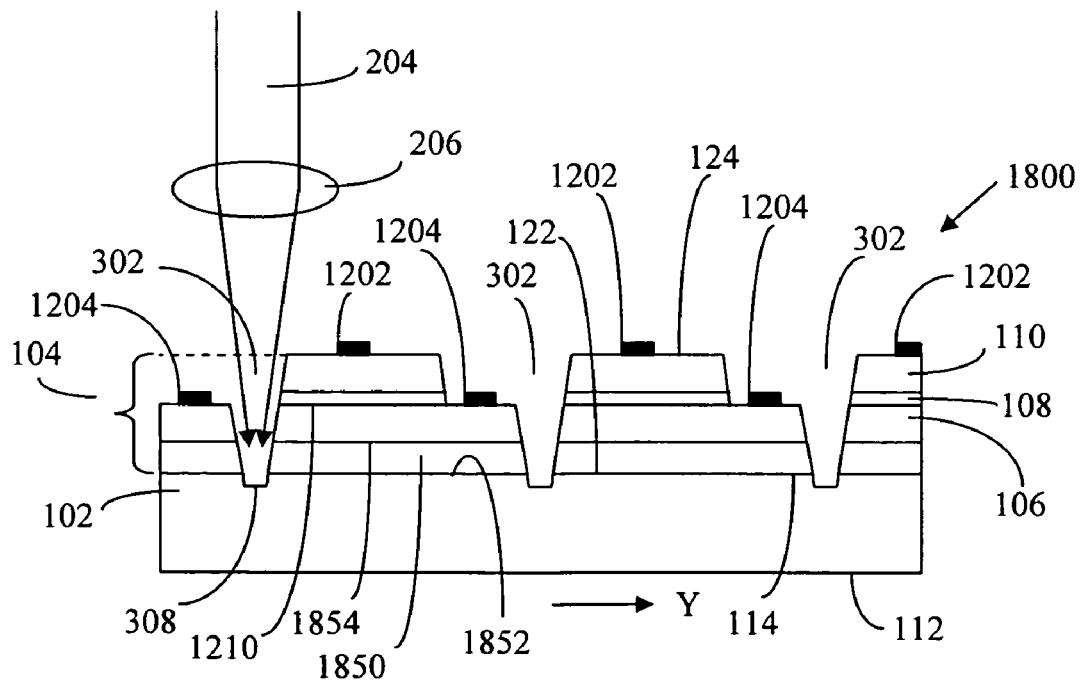
FIG. 20B is cross-sectional side view of the assembly along the II-II plane illustrated in FIG. 20A.

An optional step to form a thick, substrate-free LED chip that has two upper electrodes and an undoped layer is to etch a second array of parallel streets through the multilayer semiconductor structure in a second direction. FIGS. 20A and 20B illustrate assembly 1800 that includes a growth substrate 102, a multilayer semiconductor structure 104 that includes an undoped layer 1850, a first array of first upper electrodes 1202, a second array of second upper electrodes 1204, a first array of parallel streets 202 and a second array of parallel streets 302 that are laser etched through the multilayer semiconductor structure. FIG. 20A is a top plan view of assembly 1800 illustrating two perpendicular arrays of streets and FIG. 20B is a side cross-sectional view of the assembly along the II-II plane illustrated in FIG. 20A.

The second direction for the second array of parallel streets 302 can be at any angle to the first direction for the first array of parallel streets 202. In FIG. 20A, the second direction is substantially perpendicular to the first direction. The second direction is the X-direction and the first direction is the Y-direction.

Etching to form the second array of parallel streets 302 can be done using a laser ablation process and a pulsed first laser. The laser etching process for assembly 1800 is identical to the etching process illustrated above in FIGS. 3A and 3B for assembly 100. Preferably, the etching process goes through substantially the entire thickness of the multilayer semiconductor structure including the undoped layer 1850. Alternatively, the laser ablation goes through the entire thickness of the multilayer semiconductor structure and also ablates some of the growth substrate 102 in area 308. To form the entire array of streets 302, the laser beam is sequentially scanned across the surface 124 of assembly 1800 in the X-direction. Alternatively the laser beam is held stationary and assembly 1800 is scanned.

The next step to form a thick, substrate-free LED chip that has two upper electrodes and an undoped layer 1850 is to scan a pulsed second laser beam in at least a first direction across and through the growth substrate to form both an interfacial layer of non-uniform thickness between the multilayer semiconductor substrate and the growth substrate and to simultaneously form surface features on the first surface of the multilayer semiconductor structure. The interfacial layer will be formed at the interface of the growth substrate and the undoped layer 1850.

Figure 21A:
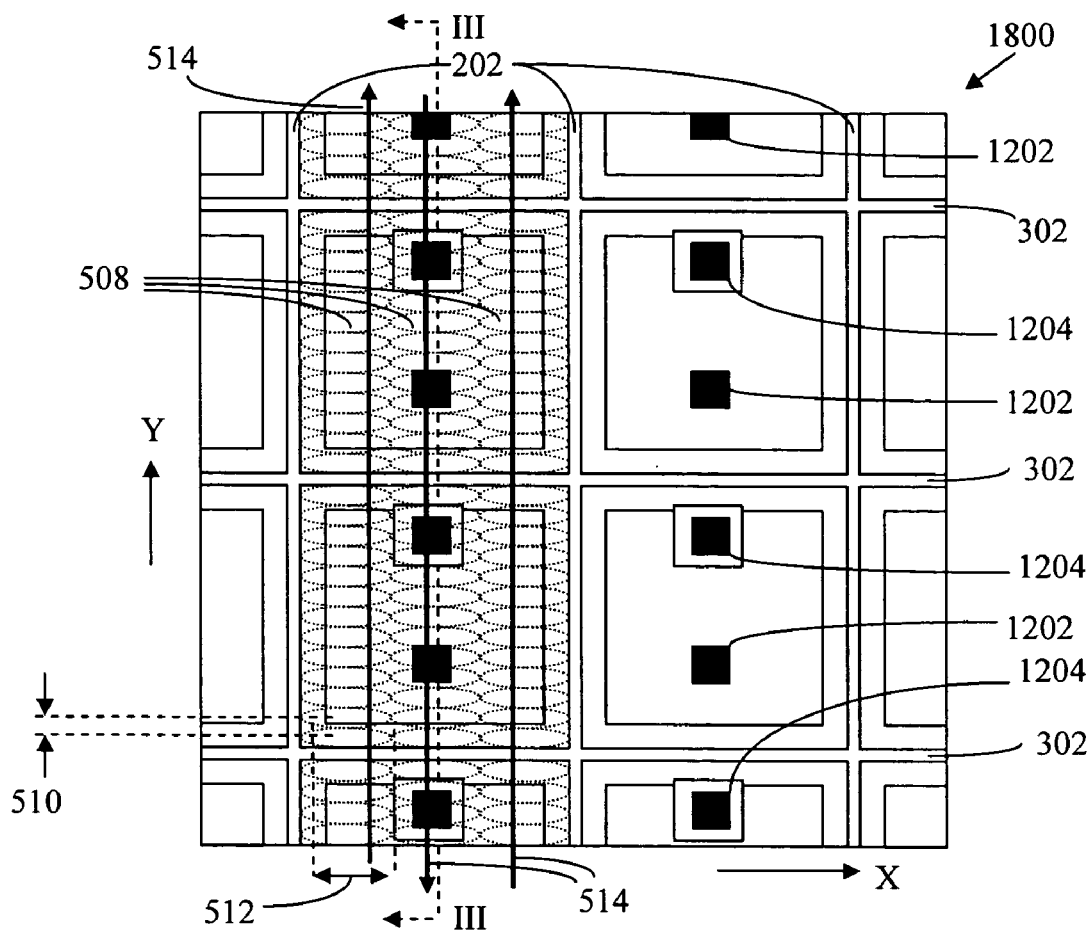
FIG. 21A is top plan view of an assembly of this present invention that illustrates a laser scanning method for simultaneous forming an interfacial layer between a growth substrate and a multilayer semiconductor structure and the formation of surface features on the multilayer semiconductor structure.
Figure 21B:
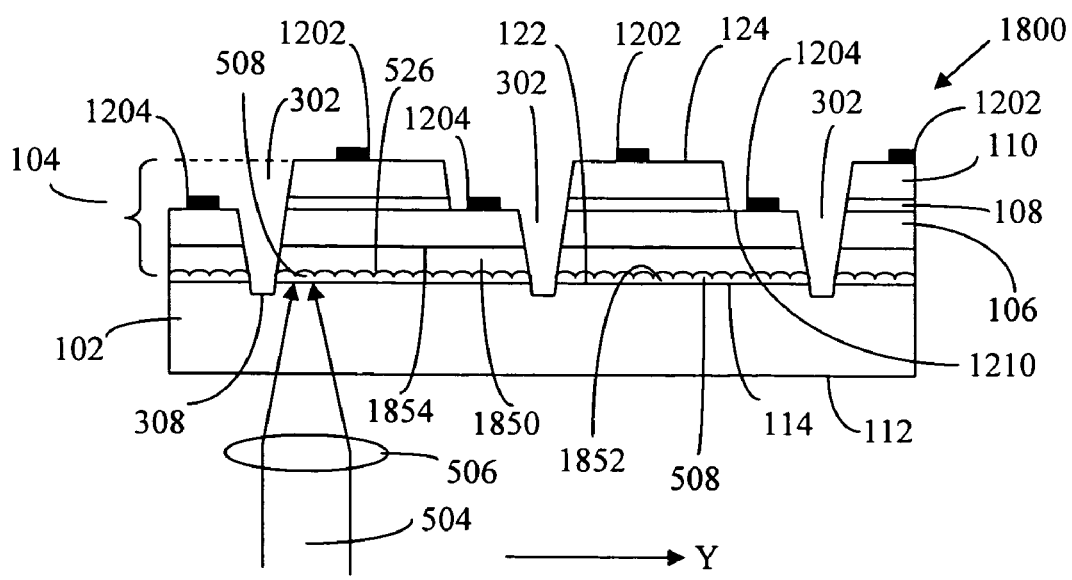
FIG. 21B is cross-sectional side view of the assembly along the III-III plane illustrated in FIG. 21A.

The scanning step is illustrated in FIGS. 21A and 21B. FIGS. 21A and 21B illustrate assembly 1800 that includes a growth substrate 102, a multilayer semiconductor structure 104 that has an updoped layer 1850, a first array of first upper electrodes 1202, a second array of second upper electrodes 1204, a first array of parallel streets 202 and a second array of parallel streets 302. Three illustrated scans 514 of a pulsed second laser beam 504 in the plus Y and minus Y-directions form both an interfacial layer 508 of non-uniform thickness and form surface features 526 on the lower surface of the multilayer semiconductor structure. FIG. 21A is a top plan view of assembly 1800 and FIG. 21B is a side cross-sectional view of the assembly along the III-III plane illustrated in FIG. 21A. The III-III plane is approximately centered on one of the three laser scans.

If desired, laser scans to form both the interfacial layer and the surface features can be done in both a first direction (the Y-direction in this example) and in a second direction (for example, the X-direction). Scans for the X-direction are not shown in the figures.

The next step to form a thick, substrate-free LED chip that has two upper electrodes and an undoped layer is to detach the multilayer semiconductor structure from the growth substrate by severing the interfacial layer. If the multilayer semiconductor structure is a GaN-based material, the interfacial layer will consist of gallium metal and any nitrogen gas that is trapped in the interfacial layer. In many cases, the LED chips will detach from the growth substrate with no additional processing. If the LED chips do not immediately detach from the growth substrate, assembly 1800 can be heated to a temperature above 30 degrees Celsius to melt the gallium and allow for easy separation. For example, the heating may be done by placing assembly 1800 in hot water with a temperature in excess of 30 degrees Celsius.

Figure 22:
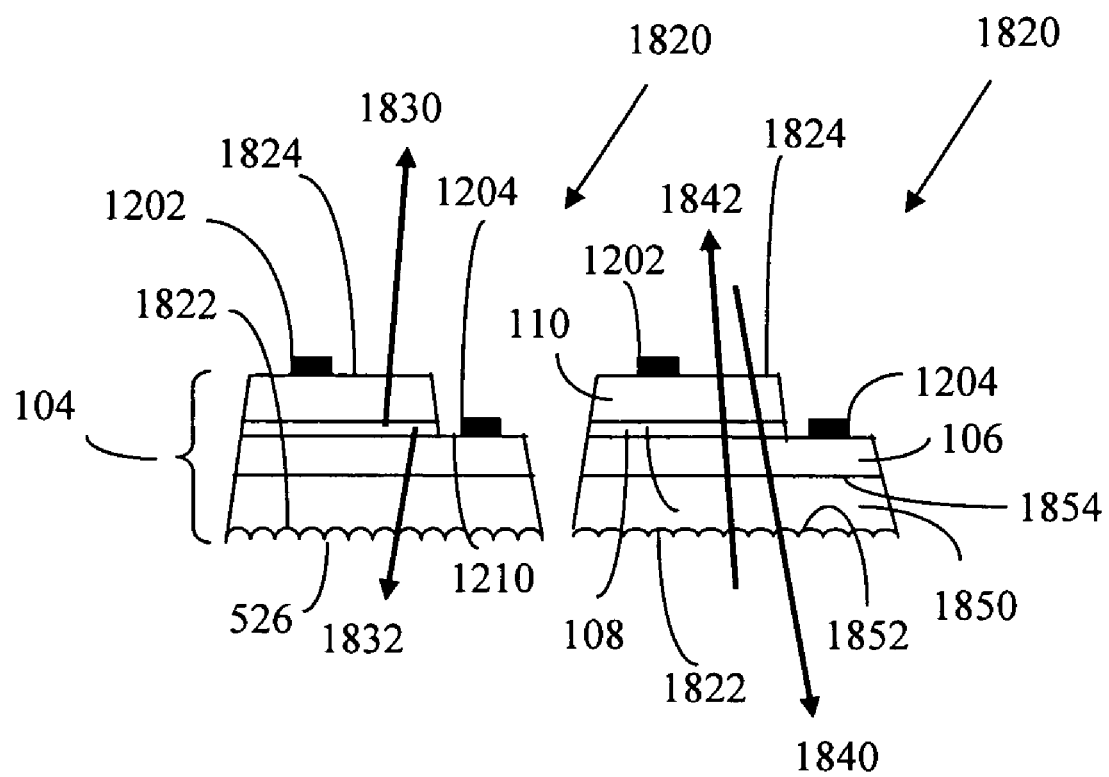
FIG. 22 is side cross-sectional view of two substrate-free LEDs having two upper electrodes and a substantially undoped layer illustrating light emission and light transmission through the light emitting diode of the present invention.

The detached structures 1820 are substrate-free LEDs, two of which are illustrated in FIG. 22. Any residue of gallium metal that remains on the layered semiconductor structure can be removed by a cleaning step (not shown).

Another embodiment of this invention is an LED fabricated by the method illustrated in FIGS. 18 to 22. An example of this embodiment is LED 1820 illustrated in FIG. 22. The LEDs 1820 have surface features 526 which can act as light extracting elements. The LEDs each have an first upper electrode 1202 and a second upper electrode 1204. The LEDs will emit light if an electrical current is applied between first upper electrodes 1202 and second upper electrode 1204.

Example light rays 1830 and 1832 in FIG. 22 illustrate the operation of LED 1820. Internally generated light ray 1830 is emitted by the active region 108 in the direction of upper surface 1824 at an angle less than the critical angle. Internally generated light ray 1830 exits LED 1820 through surface 1824. Internally generated light ray 1832 is emitted by the active region 108 in the direction of the lower surface 1822 at an angle less than the critical angle. Internally generated light ray 1832 exits LED 1820 through surface 1822.

LED chips 1820 will transmit externally incident light. Externally incident light is light that is directed to the LED chips from an outside source such as another LED. Externally incident light is illustrated in FIG. 22 by light rays 1840 and 1842. Externally incident light ray 1840 is incident on the upper surface 1824 of LED 1820. Externally incident light ray 1840 passes through the multilayer semiconductor structure 104 and exits LED through lower surface 1822. Externally incident light ray 1842 is incident on the lower surface 1822 of LED 1820. Externally incident light ray 1840 passes through the multilayer semiconductor structure 104 and exits LED through upper surface 1824.

Preferably, LED chip 1820 transmits at least 60 percent of externally incident light that is incident on the upper or lower surface of the LED. More preferably, LED chip 1820 transmits at least 70 of externally incident light. Most preferably, LED chip 1820 transmits at least 80 of externally incident light. High light transmission is important to transmit light emitted from one LED through another LED or to transmit light from a phosphor through the LED.

If desired, side 1822 of LED 1820 can be bonded onto a metal surface or leadframe. Such a surface or leadframe would also provide a thermal pathway to remove heat from the LED. Preferably such a metal surface is a light reflector to reflect any internally generated light to the opposite surface of the LED.

While the invention has been described in conjunction with specific embodiments and examples, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method for fabricating a light emitting diode chip comprising the steps of:

depositing a multilayer semiconductor structure on a transparent growth substrate, wherein said growth substrate has a first surface and a second surface opposite said first surface, wherein said multilayer semiconductor structure has a first surface in contact with said second surface of said growth substrate and a second surface opposite said first surface, wherein said multilayer semiconductor structure is at least 10 microns thick and wherein said multilayer semiconductor structure includes a first doped layer proximal to said growth substrate, an active region, and a second doped layer distal from said growth substrate, wherein said active region is interposed between said first doped layer and said second doped layer;

etching a first array of parallel streets substantially through said multilayer semiconductor structure by scanning a first laser beam directed to said second surface of said multilayer semiconductor structure; and detaching said multilayer semiconductor structure from said growth substrate wherein said first surface of said multilayer semiconductor structure is exposed.

2. The method for fabricating a light emitting diode chip of claim 1, further comprising the step of:

after etching said first array of parallel streets but before detaching said multilayer semiconductor structure from said growth substrate;

etching a second array of parallel streets substantially through said multilayer semiconductor structure at an angle to said first array of parallel streets by scanning said first laser beam directed to said second surface of said multilayer semiconductor structure.

3. The method for fabricating a light emitting diode chip of claim 1, wherein said detaching said multilayer semiconductor structure from said growth substrate comprises the steps of:

scanning a second laser beam directed at said first surface of said growth substrate in at least a first direction, wherein said second laser beam passes through said first surface of said growth substrate and through the interior of said growth substrate to said first surface of said multilayer semiconductor structure, wherein said second laser beam decomposes said first surface of said multilayer semiconductor structure, resulting in the formation of an interfacial layer of non-uniform thickness between said first surface of said multilayer semiconductor structure and said second surface of said growth substrate and the simultaneous formation of surface features on said first surface of said multilayer semiconductor structure; and removing said multilayer semiconductor structure from said growth substrate by severing said interfacial layer.

4. The method for fabricating a light emitting diode chip of claim 1, wherein said light emitting diode chip is substrate-free.

5. The method of fabricating a light emitting diode chip of claim 3 wherein said simultaneous formation of surface features on said first surface of said multilayer semiconductor structure forms light extraction elements for said light emitting diode chip.

6. The method of fabricating a light emitting diode chip of claim 3, wherein said first laser beam and said second laser beam are pulsed.

7. The method of fabricating a light emitting diode chip of claim 4, wherein said first laser beam and said second laser beam are produced by a frequency-quadrupled, diode-pumped, solid-state laser.

8. The method of fabricating a light emitting diode chip of claim 1 wherein said multilayer semiconductor structure is deposited on said growth substrate by metal-organic chemical vapor deposition.

9. The method of fabricating a light emitting diode chip of claim 1 wherein said multilayer semiconductor structure is deposited on said growth substrate by hydride vapor phase epitaxy.

10. The method of fabricating a light emitting diode chip of claim 2, wherein said step of etching said first array of parallel streets has said first laser beam elongated in a direction parallel to said first array of parallel streets and said step of etching said second array of parallel streets has said first laser beam elongated in a direction parallel to said second array of parallel streets.

11. The method of fabricating a light emitting diode chip of claim 3, wherein said second laser beam is elongated in a direction perpendicular to said first direction.

12. The method of fabricating a light emitting diode chip of claim 1, wherein said multilayer semiconductor structure is a gallium nitride based structure.

13. The method of fabricating a light emitting diode chip of claim 1, wherein said growth substrate is sapphire.

14. The method of fabricating a light emitting diode chip of claim 1, wherein said multilayer semiconductor structure has a first array of first upper electrodes in electrical contact with said second doped layer.

15. The method of fabricating a light emitting diode chip of claim 14, further comprising the step of:

fabricating a lower electrode on said first surface of said multilayer semiconductor structure of said light emitting diode chip subsequent to said detaching said multilayer semiconductor structure from said growth substrate.

16. The method of fabricating a light emitting diode chip of claim 14, wherein said multilayer semiconductor structure has a second array of second upper electrodes, wherein said second array of said second upper electrodes is formed on said multilayer semiconductor structure where portions of said second doped layer and said active region have been removed and wherein said second array of said second upper electrodes is in electrical contact with said upper surface of said first doped layer.

17. The method of fabricating a light emitting diode chip of claim 1 further comprising the step of:

depositing a light reflecting layer on said first surface of said multilayer semiconductor structure of said light emitting diode chip subsequent to said detaching said multilayer semiconductor structure from said growth substrate.

18. The method of fabricating a light emitting diode chip of claim 2, wherein said angle ranges from about 50 degrees to about 130 degrees.

19. The method of fabricating a light emitting diode chip of claim 1, wherein said multilayer semiconductor structure is at least 20 microns thick.

20. The method of fabricating a light emitting diode chip of claim 1, wherein said multilayer semiconductor structure is at least 30 microns thick.

21. The method of fabricating a light emitting diode chip of claim 1, wherein said light emitting diode chip is a plurality of said light emitting diode chips.

22. A method for fabricating a light emitting diode chip comprising the steps of:

depositing a multilayer semiconductor structure on a transparent growth substrate, wherein said growth substrate has a first surface and a second surface opposite said first surface, wherein said multilayer semiconductor structure has a first surface in contact with said second surface of said growth substrate and a second surface opposite said first surface, wherein said multilayer semiconductor structure is at least 10 microns thick and wherein said multilayer semiconductor structure includes a first doped layer proximal to said growth substrate, an active region, and a second doped layer distal from said growth substrate, wherein said active region is interposed between said first doped layer and said second doped layer;

etching a first array of parallel streets substantially through said multilayer semiconductor structure by scanning a first laser beam directed to said second surface of said multilayer semiconductor structure;

etching a second array of parallel streets substantially through said multilayer semiconductor structure at an angle to said first array of parallel streets by scanning said first laser beam directed to said second surface of said multilayer semiconductor structure;

scanning a second laser beam directed at said first surface of said growth substrate in at least a first direction, wherein said second laser beam passes through said first surface of said growth substrate and through the interior of said growth substrate to said first surface of said multilayer semiconductor structure, wherein said second laser beam decomposes said first surface of said multilayer semiconductor structure, resulting in the formation of an interfacial layer of non-uniform thickness between said first surface of said multilayer semiconductor structure and said second surface of said growth substrate and the simultaneous formation of surface features on said first surface of said multilayer semiconductor structure; and removing said multilayer semiconductor structure from said growth substrate by severing said interfacial layer wherein said first surface of said multilayer semiconductor structure is exposed.

23. The method of fabricating a light emitting diode chip of claim 22 wherein said simultaneous formation of surface features on said first surface of said multilayer semiconductor structure forms light extraction elements for said light emitting diode chip.

24. The method of fabricating a light emitting diode chip of claim 22 wherein said multilayer semiconductor structure is deposited on said growth substrate by metal-organic chemical vapor deposition.

25. The method of fabricating a light emitting diode chip of claim 22 wherein said multilayer semiconductor structure is deposited on said growth substrate by hydride vapor phase epitaxy.

* * * * *